United States Patent
Palazzotto et al.

(10) Patent No.: US 10,829,687 B2
(45) Date of Patent: Nov. 10, 2020

(54) ADDITIVE STABILIZED COMPOSITE NANOPARTICLES

(71) Applicant: 3M INNOVATIVE PROPERTIES COMPANY, St. Paul, MN (US)

(72) Inventors: Michael C. Palazzotto, Woodbury, MN (US); Saswata Chakraborty, Oakdale, MN (US); Wayne S. Mahoney, St. Paul, MN (US); Guy D. Joly, Shoreview, MN (US); Karissa L. Eckert, Ham Lake, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 330 days.

(21) Appl. No.: 15/745,745

(22) PCT Filed: Aug. 31, 2016

(86) PCT No.: PCT/US2016/049606
§ 371 (c)(1),
(2) Date: Jan. 18, 2018

(87) PCT Pub. No.: WO2017/048510
PCT Pub. Date: Mar. 23, 2017

(65) Prior Publication Data
US 2018/0208842 A1    Jul. 26, 2018

Related U.S. Application Data

(60) Provisional application No. 62/218,774, filed on Sep. 15, 2015, provisional application No. 62/234,066, filed on Sep. 29, 2015.

(51) Int. Cl.
*C09K 11/02* (2006.01)
*C09K 11/70* (2006.01)
(Continued)

(52) U.S. Cl.
CPC ............ *C09K 11/703* (2013.01); *C09K 11/02* (2013.01); *C09K 11/565* (2013.01); *C09K 11/70* (2013.01);
(Continued)

(58) Field of Classification Search
CPC ..... C09K 11/703; C09K 11/02; C09K 11/565; C09K 11/70; C09K 11/883; H01L 33/501;
(Continued)

(56) References Cited

U.S. PATENT DOCUMENTS

| 3,705,208 A | 12/1972 | Nakamuta |
| 3,708,296 A | 1/1973 | Schlesinge |

(Continued)

FOREIGN PATENT DOCUMENTS

| WO | WO 2010-003059 | 1/2010 |
| WO | WO 2010-014198 | 2/2010 |

(Continued)

OTHER PUBLICATIONS

Alivisatos, "Semiconductor Clusters, Nanocrystals, and Quantum Dots", Science, 1996, vol. 271, No. 5251, pp. 933-937.
(Continued)

*Primary Examiner* — William K Cheung
(74) *Attorney, Agent, or Firm* — Lisa P. Fulton; Kent S. Kokko

(57) ABSTRACT

A composite particle that includes: a fluorescent semiconductor core/shell nanoparticle (preferably, nanocrystal); and a stabilizing additive of the formula (I), (Continued)

wherein $R^1$ is a hydrocarbyl group, including aryl, alkaryl, alkyl or aralkyl, preferably at least one of $R^1$ is aryl or alkaryl, more preferably at least two are aryl or alkaryl; $R^2$ is $R^1$ when a is one and a $C_1$-$C_{10}$ divalent alkylene when a is 2; Z is P, As or Sb.

19 Claims, 2 Drawing Sheets

(51) Int. Cl.
  *B82Y 20/00* (2011.01)
  *C09K 11/56* (2006.01)
  *C09K 11/88* (2006.01)
  *H01L 33/50* (2010.01)
  *G02F 1/13357* (2006.01)

(52) U.S. Cl.
  CPC .......... *C09K 11/883* (2013.01); *H01L 33/501* (2013.01); *B82Y 20/00* (2013.01); *G02F 1/133615* (2013.01); *G02F 2001/133614* (2013.01); *G02F 2202/36* (2013.01); *Y10S 977/774* (2013.01); *Y10S 977/818* (2013.01); *Y10S 977/824* (2013.01); *Y10S 977/95* (2013.01)

(58) Field of Classification Search
  CPC ............... B82Y 20/00; G02F 1/133615; G02F 2001/133614; G02F 2202/36; Y10S 977/774; Y10S 977/818; Y10S 977/824; Y10S 977/95
  USPC ....................................................... 428/328
  See application file for complete search history.

(56) References Cited

U.S. PATENT DOCUMENTS

| | | | |
|---|---|---|---|
| 4,069,055 A | 1/1978 | Crivello | |
| 4,216,288 A | 8/1980 | Crivello | |
| 4,250,311 A | 2/1981 | Crivello | |
| 4,503,211 A | 3/1985 | Robins | |
| 4,857,434 A | 8/1989 | Klinger | |
| 5,084,586 A | 1/1992 | Farooq | |
| 5,124,417 A | 6/1992 | Farooq | |
| 5,462,835 A | 10/1995 | Mirle | |
| 5,587,433 A | 12/1996 | Boeckeler | |
| 6,251,303 B1 | 6/2001 | Bawendi | |
| 6,451,958 B1 | 9/2002 | Fan | |
| 6,777,460 B2 | 8/2004 | Palazzotto | |
| 6,949,206 B2 | 9/2005 | Whiteford | |
| 7,018,713 B2 | 3/2006 | Padiyath | |
| 7,160,613 B2 | 1/2007 | Bawendi | |
| 7,267,875 B2 | 9/2007 | Whiteford | |
| 7,288,468 B2 | 10/2007 | Jang | |
| 7,374,807 B2 | 5/2008 | Parce | |
| 7,572,393 B2 | 8/2009 | Whiteford | |
| 7,645,397 B2 | 1/2010 | Parce | |
| 7,648,689 B2 | 1/2010 | Tokumitsu | |
| 8,252,205 B2 | 8/2012 | Jun | |
| 8,283,412 B2 | 10/2012 | Liu | |
| 2002/0022709 A1 | 2/2002 | Mader | |
| 2008/0118755 A1 | 5/2008 | Whiteford | |
| 2008/0237540 A1 | 10/2008 | Dubrow | |
| 2010/0110728 A1 | 5/2010 | Dubrow | |
| 2010/0123155 A1 | 5/2010 | Pickett | |
| 2010/0276638 A1 | 11/2010 | Liu | |
| 2011/0051047 A1 | 3/2011 | O'Neill | |
| 2012/0113672 A1 | 5/2012 | Dubrow | |
| 2012/0193606 A1 | 8/2012 | Bawendi | |
| 2012/0205586 A1 | 8/2012 | Ren | |
| 2013/0345458 A1 | 12/2013 | Freeman | |
| 2014/0027711 A1 | 1/2014 | Breen | |
| 2014/0206096 A1* | 7/2014 | Bartel | B82Y 5/00 436/172 |
| 2014/0275431 A1 | 9/2014 | Freeman | |
| 2015/0083970 A1 | 3/2015 | Koh | |
| 2015/0098212 A1 | 4/2015 | Won | |

FOREIGN PATENT DOCUMENTS

| | | |
|---|---|---|
| WO | WO 2010-039897 | 4/2010 |
| WO | WO 2015-095296 | 6/2015 |
| WO | WO 2015-138174 | 9/2015 |
| WO | WO 2015-153148 | 10/2015 |
| WO | WO 2016-081219 | 5/2016 |
| WO | WO 2016-168048 | 10/2016 |
| WO | WO 2017-048608 | 3/2017 |

OTHER PUBLICATIONS

Crivello, "Photoinitiators for Free Radical Cationic & Anionic Photopolymerization", Second Edition, 1998, pp. 275-298.
Dabbousi, "(CdSe)ZnS Core-Shell Quantum Dots: Synthesis and Characterization of a Size Series of Highly Luminescent Nanocrystallites", Journal of Physical Chemistry B, 1997, vol. 101, No. 46, pp. 9463-9475.
Hines, "Synthesis and Characterization of Strongly Luminescing ZnS-Capped CdSe Nanocrystals", Journal of Physical Chemistry, 1996, vol. 100, No. 2, pp. 468-471.
Jung, "A Bis(phosphine)-Modified Peptide Ligand for Stable and Luminescent Quantum Dots in Aqueous Media", National Institutes of Health, 2013, vol. 45, No. 17, pp. 2426-2430.
Kim, "Oligomeric Ligands for Luminescent and Stable Nanocrystal Quantum Dots", Journal of American Chemical Society, 2003, vol. 125, pp. 14652-14653.
Murray, "Synthesis and Characterization of Nearly Monodisperse CdE (E=sulfur, selenium, tellurium) Semiconductor Nanocrystallites", Journal of the American Chemical Society, 1993, vol. 115, No. 19, pp. 8706-8715.
Peng, "Epitaxial Growth of Highly Luminescent CdSe/CdS Core/Shell Nanocrystals with Photostability and Electronic Accessibility", Journal of The American Chemical Society, 1997, vol. 119, No. 30, pp. 7019-7029.
Wang, "A Developed Ullmann Reaction to III-V Semiconductor Nanocrystals in Sealed Vacuum Tubes", The Royal Society of Chemistry, 2008, pp. 6060-6066.
Wang, "Benzene-thermal Route to InP and InAs Nanocrystals Using Triphenylphosphine and Triphenylarsine as Pnicogen Sources", Chemistry Letters, 2008, vol. 37, No. 03, pp. 306-307.
Wang, "Synthesis of InP Nanofibers from tri(m-tolyl)phosphine: An Alternative Route to Metal Phosphide Nanostructures", The Royal Society of Chemistry, 2010, vol. 39, pp. 227-233.
Zhang, "Overview of Stabilizing Ligands for Biocompatible Quantum Dot Nanocrystals", Sensors, 2011, vol. 11, pp. 11036-11055.
International Search Report for PCT International Application No. PCT/US2016/049606, dated Nov. 21, 2016, 5 pages.

* cited by examiner

ADDITIVE STABILIZED COMPOSITE NANOPARTICLES

CROSS REFERENCE TO RELATED APPLICATIONS

This application is a national stage filing under 35 U.S.C. 371 of PCT/US2016/049606, filed Aug. 31, 2016, which claims the benefit of U.S. Application No. 62/218,774, filed Sep. 15, 2015 and U.S. Application No. 62/234,066, filed Sep. 29, 2015, the disclosures of which are incorporated by reference in their entirety herein.

BACKGROUND

Quantum Dot Enhancement Films (QDEF) are used as the light source for LCD displays. Red and green quantum dots are used in QDEF with a blue LED as the light source to give the full spectrum of colors. This has the advantage of improving the color gamut over the typical LCD display and keeping the energy consumption low compared to LED displays.

Once the quantum dots are synthesized, they are often treated with an organic ligand that binds to the exterior surface of the quantum dot. Colloidal quantum dot nanoparticles (preferably, nanocrystals) that are stabilized with organic ligands and/or additives can have improved quantum yields due to passivating surface traps, controlling dispersion stability in carrier fluid (or solvent) or cured polymeric binder, stabilizing against aggregation and degradation, and influencing the kinetics of nanoparticle (preferably, nanocrystal) growth during synthesis. Therefore, optimizing the organic ligand and/or additive is important for achieving optimal quantum yield, processability, and functional lifetime in QDEF.

SUMMARY

Composite particles are provided that are capable of fluorescence and suitable for use in quantum dot enhancement films.

In one aspect, the present disclosure provides a composite particle that includes: a fluorescent semiconductor core/shell nanoparticle (preferably, nanocrystal); and a stabilizing additive combined with the core/shell nanoparticle, the stabilizing additive of the formula:

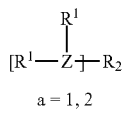

$$[R^1\!-\!Z\!+\!R_2]$$
$$\underset{a=1,2}{\overset{R^1}{|}}$$      I wherein $R^1$ is a hydrocarbyl group, including aryl, alkaryl, alkyl or aralkyl, preferably at least one of $R^1$ is aryl or alkaryl, more preferably at least two are aryl or alkaryl; $R^2$ is $R^1$ when a is 1 and a $C_1$-$C_{10}$ divalent alkylene when a is 2, Z is P, As or Sb.

In some embodiments, Z is selected from As or Sb. In some embodiments, the stabilizing additive compounds of Formula I are selected such that subscript a is 2 and $R^2$ is a $C_1$-$C_{10}$ divalent alkylene, which may be linear or branched, and is preferably linear. In some embodiments subscript a is 1, 2, and preferably three of the $R^1$ groups are aryl or alkaryl.

In some embodiments subscript a is 2, and at least two, preferably three, more preferably four of the $R^1$ groups are aryl or alkaryl.

In one aspect, the present disclosure provides a composite particle that includes: a fluorescent semiconductor core/shell nanoparticle (preferably, nanocrystal); and a stabilizing additive of Formula I combined with, attached to, or associated with, the core/shell nanoparticle. The fluorescent semiconductor core/shell nanoparticle includes: an InP core; an inner shell overcoating the core, wherein the inner shell includes zinc selenide and zinc sulfide; and an outer shell overcoating the inner shell, wherein the outer shell includes zinc sulfide.

The composite particles can be used in coatings and films for use in optical displays. The fluorescent semiconductor nanoparticles emit a fluorescence signal at a second wavelength of light when excited by a first wavelength of light that is shorter than the second wavelength of light.

As used herein

"Alkyl" means a linear or branched, cyclic or acylic, saturated monovalent hydrocarbon.

"Alkylene" means a linear or branched unsaturated divalent hydrocarbon.

"Alkenyl" means a linear or branched unsaturated hydrocarbon.

"Aryl" is an aromatic group containing 5-18 ring atoms and can contain optional fused rings, which may be saturated, unsaturated, or aromatic. Examples of an aryl groups include phenyl, naphthyl, biphenyl, phenanthryl, and anthracyl. Heteroaryl is aryl containing 1-3 heteroatoms such as nitrogen, oxygen, or sulfur and can contain fused rings. Some examples of heteroaryl groups are pyridyl, furanyl, pyrrolyl, thienyl, thiazolyl, oxazolyl, imidazolyl, indolyl, benzofuranyl, and benzthiazolyl. The aryl groups may be unsubstituted, or substituted with one of more alkyl, alkoxy or halo groups.

"Alkaryl" means an alkyl group attached to an aryl group, such as methylphenyl.

"Arylene" means a polyvalent, aromatic, such as phenylene, naphthalene, and the like.

"Aralkyl" means a group defined above with an aryl group attached to the alkylene, The term "hydrocarbyl" is used to include alkyl, aryl, aralkyl and alkylaryl. The hydrocarbyl group may be mono-, di- or polyvalent.

The term "composite particle" as used herein refers to a nanoparticle, which is typically in the form of a core/shell nanoparticle (preferably, nanocrystal), having the stabilizing additive combined with, attached to, or associated with, the core/shell nanoparticle. Such composite particles are useful as "quantum dots," which have a tunable emission in the near ultraviolet (UV) to far infrared (IR) range as a result of the use of a semiconductor material.

The term "nanoparticle" refers to a particle having an average particle diameter in the range of 0.1 to 1000 nanometers such as in the range of 0.1 to 100 nanometers or in the range of 1 to 100 nanometers. The term "diameter" refers not only to the diameter of substantially spherical particles but also to the distance along the smallest axis of the structure. Suitable techniques for measuring the average particle diameter include, for example, scanning tunneling microscopy, light scattering, and transmission electron microscopy.

A "core" of a nanoparticle is understood to mean a nanoparticle (preferably, a nanocrystal) to which no shell has been applied or to the inner portion of a core/shell nanoparticle. A core of a nanoparticle can have a homogenous composition or its composition can vary with depth inside the core. Many materials are known and used in core nanoparticles, and many methods are known in the art for applying one or more shells to a core nanoparticle. The core has a different composition than the one more shells. The core typically has a different chemical composition than the shell of the core/shell nanoparticle.

As used herein, the term "actinic radiation" refers to radiation in any wavelength range of the electromagnetic spectrum. The actinic radiation is typically in the ultraviolet wavelength range, in the visible wavelength range, in the infrared wavelength range, or combinations thereof. Any suitable energy source known in the art can be used to provide the actinic radiation.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples may be used in various combinations. In each instance, the recited list serves only as a representative group and should not be interpreted as an exclusive list.

DETAILED DESCRIPTION

Figure 1:
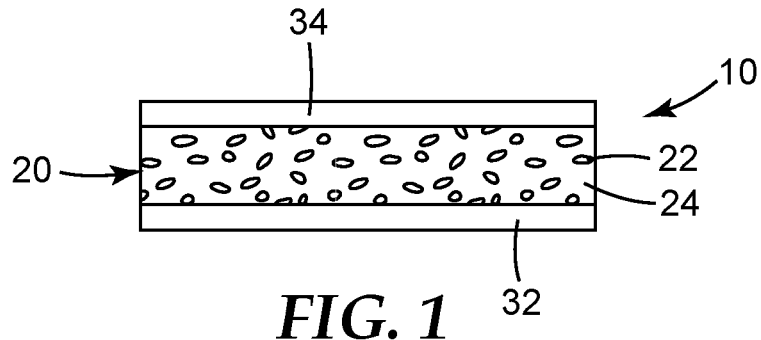
FIG. 1 is a schematic side elevation view of an edge region of an illustrative film article including quantum dots.

The present disclosure provides composite particles that contain fluorescent semiconductor nanoparticles that can fluoresce when excited with actinic radiation. The composite particles can be used in coatings and films for use in optical displays.

Fluorescent semiconductor nanoparticles emit a fluorescence signal when suitably excited. They fluoresce at a second wavelength of actinic radiation when excited by a first wavelength of actinic radiation that is shorter than the second wavelength. In some embodiments, the fluorescent semiconductor nanoparticles can fluoresce in the visible region of the electromagnetic spectrum when exposed to wavelengths of light in the ultraviolet region of the electromagnetic spectrum. In other embodiments, the fluorescent semiconductor nanoparticles can fluoresce in the infrared region when excited in the ultraviolet or visible regions of the electromagnetic spectrum. In still other embodiments, the fluorescent semiconductor nanoparticles can fluoresce in the ultraviolet region when excited in the ultraviolet region by a shorter wavelength of light, can fluoresce in the visible region when excited by a shorter wavelength of light in the visible region, or can fluoresce in the infrared region when excited by a shorter wavelength of light in the infrared region. The fluorescent semiconductor nanoparticles are often capable of fluorescing in a wavelength range such as, for example, at a wavelength up to 1200 nanometers (nm), or up to 1000 nm, up to 900 nm, or up to 800 nm. For example, the fluorescent semiconductor nanoparticles are often capable of fluorescence in the range of 400 to 800 nanometers.

The nanoparticles have an average particle diameter of at least 0.1 nanometer (nm), or at least 0.5 nm, or at least 1 nm. The nanoparticles have an average particle diameter of up to 1000 nm, or up to 500 nm, or up to 200 nm, or up to 100 nm, or up to 50 nm, or up to 20 nm, or up to 10 nm. Semiconductor nanoparticles, particularly with sizes on the scale of 1-10 nm, have emerged as a category of the most promising advanced materials for cutting-edge technologies.

Semiconductor materials include elements or complexes of Group 2-Group 16, Group 12-Group 16, Group 13-Group 15, Group 14-Group 16, and Group 14 semiconductors of the Periodic Table (using the modern group numbering system of 1-18). Some suitable quantum dots include a metal phosphide, a metal selenide, a metal telluride, or a metal sulfide. Exemplary semiconductor materials include, but are not limited to, Si, Ge, Sn, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, MgTe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Ga,In)_2(S,Se,Te)_3$, $Al_2CO$, CaS, CaSe, CaTe, SrS, SrSe, SrTe, BaS, BaSe, BaTe, and an appropriate combination of two or more such semiconductors. These semiconductor materials can be used for the core, the one or more shell layers, or both.

In certain embodiments, exemplary metal phosphide quantum dots include indium phosphide and gallium phosphide, exemplary metal selenide quantum dots include cadmium selenide, lead selenide, and zinc selenide, exemplary metal sulfide quantum dots include cadmium sulfide, lead sulfide, and zinc sulfide, and exemplary metal telluride quantum dots include cadmium telluride, lead telluride, and zinc telluride. Other suitable quantum dots include gallium arsenide and indium gallium phosphide. Exemplary semiconductor materials are commercially available from Evident Thermoelectrics (Troy, N.Y.), and from Nanosys Inc., Milpitas, Calif.

Nanocrystals (or other nanostructures) for use in the present invention can be produced using any method known to those skilled in the art. Suitable methods are disclosed in U.S. patent application Ser. No. 10/796,832, filed Mar. 10, 2004, U.S. Pat. No. 6,949,206 (Whiteford) and U.S. Provisional Patent Application No. 60/578,236, filed Jun. 8, 2004, the disclosures of each of which are incorporated by reference herein in their entireties. The nanocrystals (or other nanostructures) for use in the present invention can be produced from any suitable material, suitably an inorganic material, and more suitably an inorganic conductive or semiconductive material. Suitable semiconductor materials include those disclosed in U.S. patent application Ser. No. 10/796,832 and include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, As, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Ga, In)_2(S, Se, Te)_3$, $Al_2CO_3$ and an appropriate combination of two or more such semiconductors.

In certain aspects, the semiconductor nanocrystals or other nanostructures may comprise a dopant from the group consisting of: a p-type dopant or an n-type dopant. The nanocrystals (or other nanostructures) useful in the present invention can also comprise Group 12-Group 16 or Group 13-Group 15 semiconductors. Examples of Group 12-Group 16 or Group 13-Group 15 semiconductor nanocrystals and nanostructures include any combination of an element from Group 12, such as Zn, Cd and Hg, with any element from Group 16, such as S, Se, Te, Po, of the Periodic Table; and any combination of an element from Group 13, such as B, Al, Ga, In, and Tl, with any element from Group 15, such as N, P, As, Sb and Bi, of the Periodic Table.

Other suitable inorganic nanostructures include metal nanostructures. Suitable metals include, but are not limited to, Ru, Pd, Pt, Ni, W, Ta, Co, Mo, Ir, Re, Rh, Hf, Nb, Au, Ag, Ti, Sn, Zn, Fe, FePt, and the like.

While any known method can be used to create nanocrystal phosphors, suitably, a solution-phase colloidal method for controlled growth of inorganic nanomaterial phosphors is used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/ Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J. Am. Chem. Soc. 115:8706 (1993). This manufacturing process technology leverages low cost proccessability without the need for clean rooms and expensive manufacturing equipment. In these methods, metal precursors that undergo pyrolysis at high temperature are rapidly injected into a hot solution of organic surfactant molecules. These precursors break apart at elevated temperatures and react to nucleate nanocrystals. After this initial nucleation phase, a growth phase begins by the addition of monomers to the growing crystal. The result is freestanding crystalline nanoparticles in solution that have an organic surfactant molecule coating their surface.

Utilizing this approach, synthesis occurs as an initial nucleation event that takes place over seconds, followed by crystal growth at elevated temperature for several minutes. Parameters such as the temperature, types of surfactants present, precursor materials, and ratios of surfactants to monomers can be modified so as to change the nature and progress of the reaction. The temperature controls the structural phase of the nucleation event, rate of decomposition of precursors, and rate of growth. The organic surfactant molecules mediate both solubility and control of the nanocrystal shape.

In semiconductor nanocrystals, photo-induced emission arises from the band edge states of the nanocrystal. The band-edge emission from nanocrystals competes with radiative and non-radiative decay channels originating from surface electronic states. X. Peng, et al., J. Am. Chem. Soc. 30:7019-7029 (1997). As a result, the presence of surface defects such as dangling bonds provide non-radiative recombination centers and contribute to lowered emission efficiency. An efficient and permanent method to passivate and remove the surface trap states is to epitaxially grow an inorganic shell material on the surface of the nanocrystal. X. Peng, et al., J. Am. Chem. Soc. 30:7019-7029 (1997). The shell material can be chosen such that the electronic levels are type I with respect to the core material (e.g., with a larger bandgap to provide a potential step localizing the electron and hole to the core). As a result, the probability of non-radiative recombination can be reduced.

Core-shell structures are obtained by adding organometallic precursors containing the shell materials to a reaction mixture containing the core nanocrystal. In this case, rather than a nucleation-event followed by growth, the cores act as the nuclei, and the shells grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and ensure solubility. A uniform and epitaxially grown shell is obtained when there is a low lattice mismatch between the two materials. Additionally, the spherical shape acts to minimize interfacial strain energy from the large radius of curvature, thereby preventing the formation of dislocations that could degrade the optical properties of the nanocrystal system.

In suitable embodiments, ZnS can be used as the shell material using known synthetic processes, resulting in a high-quality emission. As above, if necessary, this material can be easily substituted, e.g., if the core material is modified. Additional exemplary core and shell materials are described herein and/or known in the art.

For many applications of quantum dots, two factors are typically considered in selecting a material. The first factor is the ability to absorb and emit visible light. This consideration makes InP a highly desirable base material. The second factor is the material's photoluminescence efficiency (quantum yield). Generally, Group 12-16 quantum dots (such as cadmium selenide) have higher quantum yield than Group 13-15 quantum dots (such as InP). The quantum yield of InP cores produced previously has been very low (<1%), and therefore the production of a core/shell structure with InP as the core and another semiconductor compound with higher bandgap (e.g., ZnS) as the shell has been pursued in attempts to improve the quantum yield.

Thus, the fluorescent semiconductor nanoparticles (i.e., quantum dots) of the present disclosure include a core and a shell at least partially surrounding the core. The core/shell nanoparticles can have two distinct layers, a semiconductor or metallic core and a shell surrounding the core of an insulating or semiconductor material. The core often contains a first semiconductor material and the shell often contains a second semiconductor material that is different than the first semiconductor material. For example, a first Group 12-16 (e.g., CdSe) semiconductor material can be present in the core and a second Group 12-16 (e.g., ZnS) semiconductor material can be present in the shell.

In certain embodiments of the present disclosure, the core includes a metal phosphide (e.g., indium phosphide (InP), gallium phosphide (GaP), aluminum phosphide (AlP)), a metal selenide (e.g., cadmium selenide (CdSe), zinc selenide (ZnSe), magnesium selenide (MgSe)), or a metal telluride (e.g., cadmium telluride (CdTe), zinc telluride (ZnTe)). In certain embodiments, the core includes a metal phosphide (e.g., indium phosphide) or a metal selenide (e.g., cadmium selenide). In certain preferred embodiments of the present disclosure, the core includes a metal phosphide (e.g., indium phosphide).

The shell can be a single layer or multilayered. In some embodiments, the shell is a multilayered shell. The shell can include any of the core materials described herein. In certain embodiments, the shell material can be a semiconductor material having a higher bandgap energy than the semiconductor core. In other embodiments, suitable shell materials can have good conduction and valence band offset with respect to the semiconductor core, and in some embodiments, the conduction band can be higher and the valence band can be lower than those of the core. For example, in certain embodiments, semiconductor cores that emit energy in the visible region such as, for example, CdS, CdSe, CdTe, ZnSe, ZnTe, GaP, InP, or GaAs, or near IR region such as, for example, InP, InAs, InSb, PbS, or PbSe may be coated with a shell material having a bandgap energy in the ultraviolet regions such as, for example, ZnS, GaN, and magnesium chalcogenides such as MgS, MgSe, and MgTe. In other embodiments, semiconductor cores that emit in the near IR region can be coated with a material having a bandgap energy in the visible region such as CdS or ZnSe.

Formation of the core/shell nanoparticles may be carried out by a variety of methods. Suitable core and shell precursors useful for preparing semiconductor cores are known in the art and can include Group 2 elements, Group 12 elements, Group 13 elements, Group 14 elements, Group 15 elements, Group 16 elements, and salt forms thereof. For example, a first precursor may include metal salt (M+X−) including a metal atom (M+) such as, for example, Zn, Cd, Hg, Mg, Ca, Sr, Ba, Ga, In, Al, Pb, Ge, Si, or in salts and a counter ion (X−), or organometallic species such as, for example, dialkyl metal complexes. The preparation of a coated semiconductor nanocrystal core and core/shell nanocrystals can be found in, for example, Dabbousi et al. (1997) *J. Phys. Chem. B* 101:9463, Hines et al. (1996) *J. Phys. Chem.* 100: 468-471, and Peng et al. (1997) *J. Amer. Chem. Soc.* 119:7019-7029, as well as in U.S. Pat. No. 8,283,412 (Liu et al.) and International Publication No. WO 2010/039897 (Tulsky et al.).

In certain preferred embodiments of the present disclosure, the shell includes a metal sulfide (e.g., zinc sulfide or cadmium sulfide). In certain embodiments, the shell includes a zinc-containing compound (e.g., zinc sulfide or zinc selenide). In certain embodiments, a multilayered shell includes an inner shell overcoating the core, wherein the inner shell includes zinc selenide and zinc sulfide. In certain embodiments, a multilayered shell includes an outer shell overcoating the inner shell, wherein the outer shell includes zinc sulfide.

In some embodiments, the core of the shell/core nanoparticle contains a metal phosphide such as indium phosphide, gallium phosphide, or aluminum phosphide. The shell contains zinc sulfide, zinc selenide, or a combination thereof. In some more particular embodiments, the core contains indium phosphide and the shell is multilayered with the inner shell containing both zinc selenide and zinc sulfide and the outer shell containing zinc sulfide.

The thickness of the shell(s) may vary among embodiments and can affect fluorescence wavelength, quantum yield, fluorescence stability, and other photostability characteristics of the nanocrystal. The skilled artisan can select the appropriate thickness to achieve desired properties and may modify the method of making the core/shell nanoparticles to achieve the appropriate thickness of the shell(s).

The diameter of the fluorescent semiconductor nanoparticles (i.e., quantum dots) of the present disclosure can affect the fluorescence wavelength. The diameter of the quantum dot is often directly related to the fluorescence wavelength. For example, cadmium selenide quantum dots having an average particle diameter of about 2 to 3 nanometers tend to fluoresce in the blue or green regions of the visible spectrum while cadmium selenide quantum dots having an average particle diameter of about 8 to 10 nanometers tend to fluoresce in the red region of the visible spectrum.

The fluorescent semiconductor nanoparticles are combined with a stabilizing additive to enhance their dispersibility in a carrier fluid. That is, the stabilizing additive tends to increase compatibility of the fluorescent semiconductor nanoparticles with a carrier fluid, and any other components of a composition (e.g., a polymeric material, precursors of the polymeric material, or combinations thereof).

Stabilization involves combining the fluorescent semiconductor nanoparticles with the stabilizing additive or combination of stabilizing additives in combination with the fluorescent semiconductor nanoparticles and that improves the quantum yield and/or stability of the fluorescent semiconductor nanoparticles. In this context, "combination", "attach" or "attached" refers to creating a stable dispersion (e.g., by hand mixing, mechanical mixing, etc.) of the stabilizing additive, the fluorescent semiconductor nanoparticle, and of the optional carrier fluid which results in increase in quantum yield and stability of the quantum dots to be suitable for their intended use. The combination of the additive with the fluorescent nanoparticle may prevent the quantum dot particles from degradation (e.g., photo- or thermal-degradation).

Various methods can be used to combine the fluorescent semiconductor nanoparticles with the stabilizing additive. For example, the additive and the fluorescent semiconductor nanoparticles can be dispersed in room temperature or heated at an elevated temperature (e.g., at least 50° C., at least 60° C., at least 80° C., or at least 90° C.) for an extended period of time (e.g., at least 5 minutes, at least 1 hour, at least 5 hours, at least 10 hours, at least 15 hours, or at least 20 hours).

If desired, any by-product of the dispersion process or any solvent used in dispersion process can be removed, for example, by distillation, rotary evaporation, or by precipitation of the nanoparticles and centrifugation of the mixture followed by decanting the liquid and leaving behind the additive combined nanoparticles. In some embodiments, the fluorescent semiconductor nanoparticles are dried to a powder. In other embodiments, the solvent used for the dispersion process is compatible (i.e., miscible) with any carrier fluids used in compositions in which the nanoparticles are included. In these embodiments, at least a portion of the solvent used for the dispersion process can be included in the carrier fluid in which the fluorescent semiconductor nanoparticles are dispersed.

In some embodiments the stabilizing additives may function as a surface modifying ligands that attach to the surface of the fluorescent semiconductor nanoparticles and may modify the surface characteristics of the fluorescent semiconductor nanoparticles. The additives may attach to the surface, for example, by adsorption, absorption, formation of an ionic bond, formation of a covalent bond, formation of a hydrogen bond, or a combination thereof.

Quantum efficiency (also known in the literature as quantum yield) is the number of defined events which occur per photon absorbed (e.g., the number of photons emitted by the nanoparticles per photon absorbed by the nanoparticles). Accordingly, one general embodiment of the present disclosure provides a population of nanoparticles that displays a quantum efficiency of 45% or greater, or 50% or greater, or 55% or greater, or 60% or greater.

The fluorescent nanoparticles are combined with stabilizing additives of the formula:

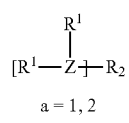

$$[R^1-Z]_a-R_2 \quad \text{I}$$
$$a = 1, 2$$

wherein $R^1$ is a hydrocarbyl group, including aryl, alkaryl, alkyl or aralkyl, preferably at least one of $R^1$ is aryl or alkaryl, more preferably at least two are aryl or alkaryl;

R² is R¹ when a is one and a $C_1$-$C_{10}$ divalent alkylene when a is 2;

Z is P, As or Sb.

Representative aryl groups include but are not limited to phenyl, tolyl, biphenyl and naphthyl. Each R¹ may optionally be substituted by hildes or alkoxy groups.

Representative phosphine additives include, but are not limited to trimethylphosphine, triethylphosphine, tri-n-propylphosphine, triisopropylphosphine, tri-n-butylphosphine, tri-sec-butylphosphine, tri-i-butylphosphine, tri-t-butylphosphine, tricyclopentylphosphine, triallylphosphine, tricyclohexylphosphine, triphenylphosphine, trinaphthylphosphine, tri-p-tolylphosphine, tri-o-tolylphosphine, tri-m-tolylphosphine, tribenzylphosphine, tri(p-trifluoromethylphenyl)phosphine, tris(trifluoromethyl)phosphine, tri(p-fluorophenyl)phosphine, tri(p-trifluoromethylphenyl)phosphine, allyldiphenylphosphine, benzyldiphenylphosphine, bis(2-furyl)phosphine, bis(4-methoxyphenyl)phenylphosphine, bis(4-methylphenyl)phosphine, bis(3,5-bis(trifluoromethyl)phenyl)phosphine, t-butylbis(trimethylsilyl)phosphine, t-butyldiphenylphosphine, cyclohexyldiphenylphosphine, diallylphenylphosphine, dibenzylphosphine, dibutylphenylphosphine, dibutylphosphine, di-t-butylphosphine, dicyclohexylphosphine, diethylphenylphosphine, di-i-butylphosphine, dimethylphenylphosphine, dimethyl(trimethylsilyl)phosphine, diphenylmeethylphosphine, diphenylpropylphosphine, diphenyl(p-tolyl)phosphine, diphenyl(trimethylsilyl)phosphine, diphenylvinylphosphine, divinylphenylphosphine, ethyldiphenylphosphine, (2-methoxyphenyl)methyl phenylphosphine, di-n-octylphenylphosphine, tris(2,6-dimethoxyphenyl)phosphine, tris(2-furyl)phosphine, tris(2-methoxyphenyl)phosphine, tris(3-methoxyphenyl)phosphine, tris(4-methoxyphenyl)phosphine, tris(3-methoxypropyl)phosphine, tris(2-thienyl)phosphine, tris(2,4,6-trimethylphenyl)phosphine, tris(trimethylsilyl)phosphine, isopropyldiphenylphosphine, dicyclohexylphenylphosphine, (+)-neomenthyldiphenylphosphine, tribenzylphosphine, diphenyl(2-methoxyphenyl)phosphine, diphenyl(pentafluorophenyl)phosphine, bis(pentafluorophenyl)phenylphosphine, and tris(pentafluorophenyl)phosphine.

Exemplary bidentate phosphine additives (Formula I, a=2) include but are not limited to (R)-(+)-2,2'-Bis(diphenylphosphino)-1,1'-binaphthyl; bis(phenylphosphino)methane and 1,2-bis(phenylphosphino)ethane, bis(diphenylphosphino)methane, 1,3-bis(diphenylphosphino)propane and 1,4-bis(diphenylphosphino)butane.

One skilled in the art will appreciate the illustrated phosphines may be substituted by the corresponding arsines and stibines as in Formula II.

In some embodiments, the stabilizing additives are selected from stibines and arsines of the formula:

$$Z^1(R^7)_3 \qquad \text{II}$$

wherein $Z^1$ is arsenic or antimony, and $R^7$ is selected from hydrocarbyl groups including alkyl, aryl, alkaryl and aralkyl. More particularly $R^7$ may be selected from linear and branched $C_1$-$C_{10}$ alkyl, $C_5$-$C_{10}$ cycloalkyl $C_6$-$C_{18}$ aryl, $C_7$-$C_{18}$ aralkyl, each of the foregoing substituents can be optionally substituted with linear or branched $C_1$-$C_5$ alkyl, Representative alkyl groups include but are not limited to methyl, ethyl, propyl, isopropyl, n-butyl, isobutyl, sec-butyl, tert-butyl, pentyl, neopentyl, hexyl, heptyl, octyl, nonyl, decyl, and dodecyl. Representative cycloalkyl groups include but are not limited to cyclopentyl and cyclohexyl. Representative aryl groups include but are not limited to phenyl, o-tolyl, biphenyl and naphthyl. Representative aralkyl groups include but are not limited to benzyl, and phenylethyl (i.e., —$CH_2CH_2PH$).

Representative arsines include triphenylarsine, tritolylarsine, and trinapthylarsine.

Representative stibines include triphenylstibine and tritolyylstibine.

Since InP may be purified by bonding with dodecylsuccinic acid (DDSA) and lauric acid (LA) first, following by precipitation from ethanol, the precipitated quantum dots may have some of the acid functional ligands attached thereto, prior to dispersing in the fluid carrier. Similarly, CdSe quantum dots may be functionalized with amine-functional ligands as result of their preparation, prior to functionalization with the instant ligands. As result, the quantum dots may be functionalized with a combination of the instant stabilizing additives and those surface modifying additives or ligands resulting from the original synthesis of the nanoparticles.

As result, the quantum dots may be surface modified with ligands of Formula III:

$$R^5\text{—}R^{12}(X)_n \qquad \text{III}$$

wherein $R^5$ is (hetero)hydrocarbyl group having C2 to C30 carbon atoms;

$R^{12}$ is a hydrocarbyl group including alkylene, arylene, alkarylene and aralkylene;

n is at least one;

X is a ligand group, including —$CO_2H$, —$SO_3H$, —$P(O)(OH)_2$, —$OP(O)(OH)$, —OH and —$NH_2$.

Such additional surface modifying ligands may be added when the functionalizing with the stabilizing additives of Formula I, or may be attached to the nanoparticles as result of the synthesis. Such additional surface modifying agents are present in amounts less than or equal to the weight of the instant stabilizing additives, preferably 10 wt. % or less, relative to the amount of the ligands.

Various methods can be used to surface modify the fluorescent semiconductor nanoparticles with the ligand compounds. In some embodiments, procedures similar to those described in U.S. Pat. No. 7,160,613 (Bawendi et al.) and U.S. Pat. No. 8,283,412 (Liu et al.) can be used to add the surface modifying agent. For example, the ligand compound and the fluorescent semiconductor nanoparticles can be heated at an elevated temperature (e.g., at least 50° C., at least 60° C., at least 80° C., or at least 90° C.) for an extended period of time (e.g., at least 1 hour, at least 5 hours, at least 10 hours, at least 15 hours, or at least 20 hours).

If desired, any by-product of the synthesis process or any solvent used in surface-modification process can be removed, for example, by distillation, rotary evaporation, or by precipitation of the nanoparticles and centrifugation of the mixture followed by decanting the liquid and leaving behind the surface-modified nanoparticles. In some embodiments, the surface-modified fluorescent semiconductor nanoparticles are dried to a powder after surface-modification. In other embodiments, the solvent used for the surface modification is compatible (i.e., miscible) with any carrier fluids used in compositions in which the nanoparticles are included. In these embodiments, at least a portion of the solvent used for the surface-modification reaction can be included in the carrier fluid in which the surface-modified, fluorescent semiconductor nanoparticles are dispersed.

The stabilizing additives of Formulas I and II may function, at least in part, to reduce the number of aggregated fluorescent semiconductor nanoparticles within the dispersion composition. The formation of aggregated fluorescent semiconductor nanoparticles can alter the fluorescent characteristics or quantum efficiency of the dispersion composition.

Composite nanoparticles (i.e., fluorescent semiconductor nanoparticles combined with the stabilizing additives) can be used in conventional electronics, semiconductor devices, electrical systems, optical systems, consumer electronics, industrial or military electronics, and nanocrystal, nanowire (NW), nanorod, nanotube, sensing applications, and light-emitting diode (LED) lighting applications and nanoribbon technologies.

The stabilized nanoparticles comprising the fluorescent semiconductor nanoparticles and stabilizing additive may be dispersed in a solution that contains (a) an optional carrier fluid and (b) a polymeric binder, a precursor of the polymeric binder, or combinations thereof. The stabilized nanoparticles may be dispersed in the carrier fluid, which is then dispersed in the polymeric binder, forming droplets of the nanoparticles in the carrier, fluid, which in turn are dispersed in the polymeric binder.

The dispersion composition preferably includes a non-aqueous carrier fluid. As used herein, the term "non-aqueous" means that no water is purposefully added to the compositions. However, a small amount of water might be present as an impurity in other components or might be present as a reaction by-product of a surface modification process or the polymerization process. The carrier fluids are typically selected to be compatible (i.e., miscible) with the ligand/additive added to the surface of the fluorescent semiconductor nanoparticles.

Suitable carrier fluids include, but are not limited to, aromatic hydrocarbons (e.g., toluene, benzene, or xylene), aliphatic hydrocarbons such as alkanes (e.g., cyclohexane, heptane, hexane, or octane), alcohols (e.g., methanol, ethanol, isopropanol, or butanol), ketones (e.g., acetone, methyl ethyl ketone, methyl isobutyl ketone, or cyclohexanone), aldehydes, amines, amides, esters (e.g., amyl acetate, ethylene carbonate, propylene carbonate, or methoxypropyl acetate), glycols (e.g., ethylene glycol, propylene glycol, butylene glycol, triethylene glycol, diethylene glycol, hexylene glycol, or glycol ethers such as those commercially available from Dow Chemical, Midland, Mich. under the trade designation DOWANOL), ethers (e.g., diethyl ether), dimethyl sulfoxide, tetramethylsulfone, halocarbons (e.g., methylene chloride, chloroform, or hydrofluoroethers), or combinations thereof. Preferred carrier fluids include aromatic hydrocarbons (for e.g., toluene), aliphatic hydrocarbons such as alkanes.

The optional non-polymeric carrier fluids are inert, liquid at 25° C. and have a boiling point ≥100° C., preferably ≥150° C.; and can be one or a mixture of liquid compounds. Higher boiling points are preferred so that the carrier fluids remain when organic solvents used in the preparation are removed.

In some embodiments the carrier fluid is an oligomeric or polymeric carrier fluid. The polymeric carriers provide a medium of intermediate viscosity that is desirable for further processing of the additive in combination with the fluorescent nanoparticle into a thin film. The polymeric carrier is preferably selected to form a homogenous dispersion with the additive combined fluorescent nanoparticle, but preferably incompatible with the curable polymeric binders. The polymeric carriers are liquid at 25° C. and include polysiloxanes, such a polydimethylsiloxane, liquid fluorinated polymers, including perfluoropolyethers, (poly(acrylates), polyethers, such as poly(ethylene glycol), poly(propylene glycol), and poly(butylene glycol). A preferred polymeric polysiloxane is polydimethylsiloxane.

The stabilizing additive is desirably soluble in a carrier fluid at room temperature in an amount of at least 0.1 wt-%, preferably at least 1 wt. %.

As the quantum dots are often prepared in an organic solvent, the carrier fluid enables separation and removal of any organic solvent.

The ligand/additive functionalized nanoparticles and carrier fluid form a solution or dispersion that is preferably transparent when viewed with the human eye. Likewise, any precursors of the polymeric materials that are included in the dispersion composition are soluble in a carrier fluid and preferably form a coating that is preferably transparent when viewed with the unaided human eye. The term transparent means transmitting at least 85% of incident light in the visible spectrum (about 400-700 nm wavelength).

The polymeric binders or resins desirably provide barrier properties to exclude oxygen and moisture when cured. If water and/or oxygen enter the quantum dot article, the quantum dots can degrade and ultimately fail to emit light when excited by ultraviolet or blue light irradiation. Slowing or eliminating quantum dot degradation along the laminate edges is particularly important to extend the service life of the displays in smaller electronic devices such as those utilized in, for example, handheld devices and tablets.

Exemplary polymeric binders include, but are not limited to, polysiloxanes, fluoroelastomers, polyamides, polyimides, polycarolactones, polycaprolactams, polyurethanes, polyethers, polyvinyl chlorides, polyvinyl acetates, polyesters, polycarbonates, polyacrylates, polymethacrylates, polyacrylamides, and polymethacrylamides.

Suitable precursors of the polymeric binder or resin include any precursor materials used to prepare the polymeric materials listed above. Exemplary precursor materials include acrylates that can be polymerized to polyacrylates, methacrylates that can be polymerized to form polymethacrylates, acrylamides that can be polymerized to form polyacrylamides, methacrylamides that can be polymerized to form polymethacrylamides, epoxy resins and dicarboxylic acids that can be polymerized to form polyesters, diepoxides that can be polymerized to form polyethers, isocyanates and polyols that can be polymerized to form polyurethanes, or polyols and dicarboxylic acids that can be polymerized to form polyesters.

In some embodiments, such as CdSe, the polymeric binder is a thermally curable epoxy-amine composition optionally further comprising a radiation-curable acrylate as described in Applicant's copending WO 2015095296 (Eckert et al.); Thiol-epoxy resins as described in US 62/148,219 (Qiu et al., filed 16 Apr. 2015), thiol-alkene-epoxy resins as described in US 62/148,212 (Qui et al. filed 16 Apr. 2015); thiol-alkene resins as described in US 62/080,488 (Qui et al., filed 17 Nov. 2014), and thiol silicones as described in US 61/950,281 (Qiu et al., filed 10 Mar. 2014).

In some preferred embodiments the polymeric binder is a radiation curable oligomer having the general formula $R^{Olig}\text{-}(L^1\text{-}Z^1)_d$, wherein $R^{Olig}$ groups include urethanes, polyurethanes, esters, polyesters, polyethers, polyolefins, polybutadienes and epoxies;

$L^1$ is a linking group;

$Z^1$ is a pendent, free-radically polymerizable group such as (meth)acryloyl, vinyl or alkynyl and is preferably a (meth)acrylate, and d is greater than 1, preferably at least 2.

The linking group $L^1$ between the oligomer segment and ethylenically unsaturated end group includes a divalent or higher valency group selected from an alkylene, arylene, heteroalkylene, or combinations thereof and an optional divalent group selected from carbonyl, ester, amide, sulfonamide, or combinations thereof. $L^1$ can be unsubstituted or substituted with an alkyl, aryl, halo, or combinations thereof. The $L^1$ group typically has no more than 30 carbon atoms. In some compounds, the $L^1$ group has no more than 20 carbon atoms, no more than 10 carbon atoms, no more than 6 carbon atoms, or no more than 4 carbon atoms. For example, $L^1$ can be an alkylene, an alkylene substituted with an aryl group, or an alkylene in combination with an arylene or an alkyl ether or alkyl thioether linking group.

The pendent, free radically polymerizable functional groups $Z^1$ may be selected from the group consisting of vinyl, vinyl ether, ethynyl, and (meth)acyroyl which includes acrylate, methacrylate, acrylamide and methacrylamide groups.

The oligomeric group $R^{olig}$ may be selected from poly (meth)acrylate, polyurethane, polyepoxide, polyester, polyether, polysulfide, polybutadiene, hydrogenated polyolefins (including hydrogenated polybutadienes, isoprenes and ethylene/propylene copolymers, and polycarbonate oligomeric chains.

As used herein, "(meth)acrylated oligomer" means a polymer molecule having at least two pendent (meth)acryloyl groups and a weight average molecular weight ($M_w$) as determined by Gel Permeation Chromatography of at least 1,000 g/mole and typically less than 50,000 g/mole.

(Meth)acryloyl epoxy oligomers are multifunctional (meth)acrylate esters and amides of epoxy resins, such as the (meth)acrylated esters of bisphenol-A epoxy resin. Examples of commercially available (meth)acrylated epoxies include those known by the trade designations EBECRYL 600 (bisphenol A epoxy diacrylate of 525 molecular weight), EBECRYL 605 (EBECRYL 600 with 25% tripropylene glycol diacrylate), EBECRYL 3700 (bisphenol-A diacrylate of 524 molecular weight) and EBECRYL 3720H (bisphenol A diacrylate of 524 molecular weight with 20% hexanediol diacrylate) available from Cytec Industries, Inc., Woodland Park, N.J.; and PHOTOMER 3016 (bisphenol A epoxy acrylate), PHOTOMER 3016-40R (epoxy acrylate and 40% tripropylene glycol diacrylate blend), and PHOTOMER 3072 (modified bisphenol A acrylate, etc.) available from BASF Corp., Cincinnati, Ohio, and Ebecryl 3708 (modified bisphenol A epoxy diacrylate) available from Cytec Industries, Inc., Woodland Park, N.J.

(Meth)acrylated urethanes are multifunctional (meth) acrylate esters of hydroxy terminated isocyanate extended polyols, polyesters or polyethers. (Meth)acrylated urethane oligomers can be synthesized, for example, by reacting a diisocyanate or other polyvalent isocyanate compound with a polyvalent polyol (including polyether and polyester polyols) to yield an isocyanate terminated urethane prepolymer. A polyester polyol can be formed by reacting a polybasic acid (e.g., terephthalic acid or maleic acid) with a polyhydric alcohol (e.g., ethylene glycol or 1,6-hexanediol). A polyether polyol useful for making the acrylate functionalized urethane oligomer can be chosen from, for example, polyethylene glycol, polypropylene glycol, poly(tetrahydrofuran), poly(2-methyl-tetrahydrofuran), poly(3-methyl-tetrahydrofuran) and the like. Alternatively, the polyol linkage of an acrylated urethane oligomer can be a polycarbonate polyol.

Subsequently, (meth)acrylates having a hydroxyl group can then be reacted with the terminal isocyanate groups of the prepolymer. Both aromatic and the preferred aliphatic isocyanates can be used to react with the urethane to obtain the oligomer. Examples of diisocyanates useful for making the (meth)acrylated oligomers are 2,4-tolylene diisocyanate, 2,6-tolylene diisocyanate, 1,3-xylylene diisocyanate, 1,4-xylylene diisocyanate, 1,6-hexane diisocyanate, isophorone diisocyanate and the like. Examples of hydroxy terminated acrylates useful for making the acrylated oligomers include, but are not limited to, 2-hydroxyethyl (meth)acrylate, 2-hydroxypropyl (meth)acrylate, α-hydroxybutyl acrylate, polyethylene glycol (meth)acrylate and the like.

A (meth)acrylated urethane oligomer can be, for example, any urethane oligomer having at least two acrylate functionalities and generally less than about six functionalities. Suitable (meth)acrylated urethane oligomers are also commercially available such as, for example, those known by the trade designations PHOTOMER 6008, 6019, 6184 (aliphatic urethane triacrylates) available from Henkel Corp.; EBECRYL 220 (hexafunctional aromatic urethane acrylate of 1000 molecular weight), EBECRYL 284 (aliphatic urethane diacrylate of 1200 molecular weight diluted with 12% of 1,6-hexanediol diacrylate), EBECRYL 4830 (aliphatic urethane diacrylate of 1200 molecular weight diluted with 10% of tetraethylene glycol diacrylate), and EBECRYL 6602 (trifunctional aromatic urethane acrylate of 1300 molecular weight diluted with 40% of trimethylolpropane ethoxy triacrylate), available from UCB Chemical; and SARTOMER CN1963, 963E75, 945A60, 963B80, 968, and 983) available from Sartomer Co., Exton, Pa.

Properties of these materials may be varied depending upon selection of the type of isocyanate, the type of polyol modifier, the reactive functionality and molecular weight. Diisocyanates are widely used in urethane acrylate synthesis and can be divided into aromatic and aliphatic diisocyanates. Aromatic diisocyanates are used for manufacture of aromatic urethane acrylates which have significantly lower cost than aliphatic urethane acrylates but tend to noticeably yellow on white or light colored substrates. Aliphatic urethane acrylates include aliphatic diisocyanates that exhibit slightly more flexibility than aromatic urethane acrylates that include the same functionality, a similar polyol modifier and at similar molecular weight.

The curable composition may comprise a functionalized poly(meth)acrylate oligomer, which may be obtained from the reaction product of: (a) from 50 to 99 parts by weight of (meth)acrylate ester monomer units that are homo- or co-polymerizable to a polymer (b) from 1 to 50 parts by weight of monomer units having a pendent, free-radically polymerizable functional group. Examples of such materials are available from Lucite International (Cordova, Tenn.) under the trade designations of Elvacite 1010, Elvacite 4026, and Elvacite 4059.

The (meth)acrylated poly(meth)acrylate oligomer may comprise a blend of an acrylic or hydrocarbon polymer with multifunctional (meth)acrylate diluents. Suitable polymer/diluent blends include, for example, commercially available products such as EBECRYL 303, 745 and 1710 all of which are available from Cytec Industries, Inc., Woodland Park, N.J.

The curable composition may comprise a (meth)acrylated polybutadiene oligomer, which may be obtained from a carboxyl- or hydroxyl-functionalized polybutadiene. By carboxyl or hydroxy functionalised polybutadiene is meant to designate a polybutadiene comprising free —OH or —COOH groups. Carboxyl functionalized polybutadienes are known, they have for example been described in U.S. Pat. No. 3,705,208 (Nakamuta et al.) and are commercially available under the trade name of Nisso PB C-1000 (Nisso America, New York, N.Y.). Carboxyl functionalized polybutadienes can also be obtained by the reaction of a hydroxyl functionalized polybutadiene (that is a polybutadiene having free hydroxyl groups) with a cyclic anhydride such as for example has been described in U.S. Pat. No. 5,587,433 (Boeckeler), U.S. Pat. No. 4,857,434 (Klinger) and U.S. Pat. No. 5,462,835 (Mirle).

Carboxyl and hydroxyl functionalized polybutadienes suitable for being used in the process according to the present invention contain besides the carboxyl and/or hydroxyl groups, units derived from the polymerization of butadiene. The polybutadiene (PDB) generally comprises 1-4 cis units/1-4 trans units/1-2 units in a ratio a/b/c where a, b and c range from 0 to 1 with a+b+c=1. The number average molecular weight (Mn) of the functionalized polybutadiene is preferably from 200 to 10000 Da. The $M_n$ is more preferably at least 1000. The $M_n$ more preferably does not exceed 5000 Da. The —COOH or —OH functionality is generally from 1.5 to 9, preferably from 1.8 to 6.

Exemplary hydroxyl and carboxyl polybutadienes include without limitation Poly BD R-20LM (hydroxyl functionalized PDB, a=0.2, b=0.6, c=0.2, $M_n$ 1230) and Poly BD R45-HT (hydroxyl functionalized PDB, a=0.2, b=0.6, c=0.2, $M_n$ 2800) commercialized by Atofina, Nisso-PB G-1000 (hydroxyl functionalized PDB, a=0, b<0.15, c>0.85, $M_n$ 1250-1650), Nisso-PB G-2000 (hydroxyl functionalized PDB, a=0, b<0.15, c>0.85, $M_n$ 1800-2200), Nisso-PB G-3000 (hydroxyl functionalized PDB, a=0, b<0.10, c>0.90, $M_n$ 2600-3200), Nisso-PB C-1000 (carboxyl functionalized PDB, a=0, b<0.15, c>0.85, Mn 1200-1550) obtainable from Nisso America, New York, N.Y.

When carboxyl functionalized polybutadienes obtained from the reaction of a hydroxyl functionalized polybutadiene with a cyclic anhydride are used, this cyclic anhydride preferably include phthalic anhydride, hexahydrophthalic anhydride, glutaric anhydride, succinic anhydride, dodecenylsuccinic anhydride, maleic anhydride, trimellitic anhydride, pyromellitic anhydride. Mixtures of anhydrides can also be used. The amount of anhydride used for the preparation of a carboxyl functionalized polybutadiene from a hydroxyl functionalized polybutadiene is generally at least 0.8 molar, preferably at least 0.9 molar and more preferably at least 0.95 molar equivalent per molar equivalents of—OH groups present in the polybutadiene.

A (meth)acrylated polybutadiene oligomer, which is the reaction product of a carboxyl functionalized polybutadiene, may be prepared with a (meth)acrylated monoepoxide. (Meth)acrylated mono-epoxides are known. Examples of (meth)acrylated mono-epoxides that can be used are glycidyl (meth)acrylate esters, such as glycidylacrylate, glycidylmethacrylate, 4-hydroxybutylacrylate glycidylether, bisphenol-A diglycidylether monoacrylate. The (meth)acrylated mono-epoxides are preferably chosen from glycidylacrylate and glycidylmethacrylate. Alternatively, a (meth) acrylated polybutadiene oligomer which is the reaction product of a hydroxyl functionalized polybutadiene may be prepared with a (meth)acrylate ester, or halide.

Some (meth)acrylated polybutadienes that can be used, for example, include Ricacryl 3100 and Ricacryl 3500, manufactured by Sartomer Company, Exton, Pa., USA, and Nisso TE-2000 available from Nisso America, New York, N.Y. Alternatively, other methacrylated polybutadienes can be used. These include dimethacrylates of liquid polybutadiene resins composed of modified, esterified liquid polybutadiene diols. These are available under the tradename CN301 and CN303, and CN307, manufactured by Sartomer Company, Exton, Pa., USA. Regardless which methacrylated polybutadiene is used with embodiments of the invention, the methacrylated polybutadiene can include a number of methacrylate groups per chain from about 2 to about 20.

Alternatively, the acrylate functionalized oligomers can be polyester acrylate oligomers, acrylated acrylic oligomers, acrylated epoxy oligomers, polycarbonate acrylate oligomers or polyether acrylate oligomers. Useful epoxy acrylate oligomers include CN2003B from Sartomer Co. (Exton, Pa.). Useful polyester acrylate oligomers include CN293, CN294, and CN2250, 2281, 2900 from Sartomer Co. (Exton, Pa.) and EBECRYL 80, 657, 830, and 1810 from UCB Chemicals (Smyrna, Ga.). Suitable polyether acrylate oligomers include CN501, 502, and 551 from Sartomer Co. (Exton, Pa.). Useful polycarbonate acrylate oligomers can be prepared according to U.S. Pat. No. 6,451,958 (Sartomer Technology Company Inc., Wilmington, Del.).

In each embodiment comprising a (meth)acrylated oligomer, the curable binder composition optionally, yet preferably, comprises diluent monomer in an amount sufficient to reduce the viscosity of the curable composition such that it may be coated on a substrate. In some embodiments, the composition may comprise up to about 70 wt-% diluent monomers to reduce the viscosity of the oligomeric component to less than 10000 centipoise and to improve the processability.

Useful monomers are desirably soluble or miscible in the (meth)acrylated oligomer, highly polymerizable therewith. Useful diluents are mono- and polyethylenically unsaturated monomers such as (meth)acrylates or (meth)acrylamides. Suitable monomers typically have a number average molecular weight no greater than 450 g/mole. The diluent monomer desirably has minimal absorbance at the wavelength of the radiation used to cure the composition. Such diluent monomers may include, for example, n-butyl acrylate, isobutyl acrylate, hexyl acrylate, 2-ethyl-hexylacrylate, isooctylacrylate, caprolactoneacrylate, isodecylacrylate, tridecylacrylate, laurylmethacrylate, methoxy-polyethyleneglycol-monomethacrylate, laurylacrylate, tetrahydrofurfurylacrylate, ethoxy-ethoxyethyl acrylate and ethoxylatednonylacrylate. Especially preferred are 2-ethylhexylacrylate, ethoxy-ethoxyethyl acrylate, tridecylacrylate and ethoxylated nonylacrylate. High $T_g$ monomers having one ethylenically unsaturated group and a glass transition temperature of the corresponding homopolymer of 50° C. or more which are suitable in the present invention, include, for example, N-vinylpyrrolidone, N-vinyl caprolactam, isobornyl acrylate, acryloylmorpholine, isobornylmethacrylate, phenoxyethylacrylate, phenoxyethylmethacrylate, methylmethacrylate and acrylamide.

Furthermore, the diluent monomers may contain an average of two or more free-radically polymerizable groups. A diluent having three or more of such reactive groups can be present as well. Examples of such monomers include: $C_2$-$C_{18}$ alkylenedioldi(meth)acrylates, $C_3$-$C_{18}$ alkylenetrioltri(meth)acrylates, the polyether analogues thereof, and the like, such as 1,6-hexanedioldi(meth)acrylate, trimethylolpropanetri(meth)acrylate, triethyleneglycoldi(meth)acrylate, pentaeritritoltri(meth)acrylate, and tripropyleneglycol di(meth)acrylate, and di-trimethylolpropane tetraacrylate.

Suitable preferred diluent monomers include for example benzyl (meth)acrylate, phenoxyethyl (meth)acrylate; phenoxy-2-methylethyl (meth)acrylate; phenoxyethoxyethyl (meth)acrylate, 1-naphthyloxy ethyl acrylate; 2-naphthyloxy ethyl acrylate; phenoxy 2-methylethyl acrylate; phenoxyethoxyethyl acrylate; 2-phenylphenoxy ethyl acrylate; 4-phenylphenoxy ethyl acrylate; and phenyl acrylate.

Preferred diluent monomers includes phenoxyethyl (meth)acrylate, benzyl (meth)acrylate, and tricyclodecane dimethanol diacrylate. Phenoxyethyl acrylate is commercially available from Sartomer under the trade designation "SR339"; from Eternal Chemical Co. Ltd. under the trade designation "Etermer 210"; and from Toagosei Co. Ltd under the trade designation "TO-1166". Benzyl acrylate is commercially available from Osaka Organic Chemical, Osaka City, Japan. Tricyclodecane dimethanol diacrylate is commercially available from Sartomer under the trade designation "SR833 S".

Such optional monomer(s) may be present in the polymerizable composition in amount of at least about 5 wt-%. The optional monomer(s) typically total no more than about 70 wt-% of the curable composition. The some embodiments the total amount of diluent monomer ranges from about 10 wt-% to about 50-%.

When using a free-radically curable polymeric binder, the curable composition further comprises photoinitiators, in an amount between the range of about 0.1% and about 5% by weight.

Useful photoinitiators include those known as useful for photocuring free-radically polyfunctional (meth)acrylates. Exemplary photoinitiators include benzoin and its derivatives such as alpha-methylbenzoin; alpha-phenylbenzoin; alpha-allylbenzoin; alpha-benzylbenzoin; benzoin ethers such as benzil dimethyl ketal (e.g., "IRGACURE 651" from BASF, Florham Park, N.J.), benzoin methyl ether, benzoin ethyl ether, benzoin n-butyl ether; acetophenone and its derivatives such as 2-hydroxy-2-methyl-1-phenyl-1-propanone (e.g., "DAROCUR 1173" from BASF, Florham Park, N.J.) and 1-hydroxycyclohexyl phenyl ketone (e.g., "IRGACURE 184" from BASF, Florham Park, N.J.); 2-methyl-[4-(methylthio)phenyl]-2-(4-morpholinyl)-1-propanone (e.g., "IRGACURE 907" from BASF, Florham Park, N.J.); 2-benzyl-2-(dimethylamino)-1-[4-(4-morpholinyl) phenyl]-1-butanone (e.g., "IRGACURE 369" from BASF, Florham Park, N.J.) and phosphine oxide derivatives such as ethyl-2,4,6-trimethylbenzoylphenylphoshinate (e.g. "TPO-L" from BASF, Florham Park, N.J.), and IRGACURE 819 (phenylbis(2,4,6-trimethylbenzoyl)phosphine oxide) available from BASF, Florham Park, N.J.

Other useful photoinitiators include, for example, pivaloin ethyl ether, anisoin ethyl ether, anthraquinones (e.g., anthraquinone, 2-ethylanthraquinone, 1-chloroanthraquinone, 1,4-dimethylanthraquinone, 1-methoxyanthraquinone, or benzanthraquinone), halomethyltriazines, benzophenone and its derivatives, iodonium salts and sulfonium salts, titanium complexes such as bis(eta5-2,4-cyclopentadien-1-yl)-bis[2,6-difluoro-3-(1H-pyrrol-1-yl) phenyl]titanium (e.g., "CGI 784DC" from BASF, Florham Park, N.J.); halomethyl-nitrobenzenes (e.g., 4-bromomethylnitrobenzene), mono- and bis-acylphosphines (e.g., "IRGACURE 1700", "IRGACURE 1800", "IRGACURE 1850", and "DAROCUR 4265").

In some embodiments, the polymeric binder is an epoxy compound that can be cured or polymerized by the processes that are those known to undergo cationic polymerization and include 1,2-, 1,3-, and 1,4-cyclic ethers (also designated as 1,2-, 1,3-, and 1,4-epoxides). Suitable epoxy binders can include, for example, those epoxy binders described in U.S. Pat. No. 6,777,460. In particular, cyclic ethers that are useful include the cycloaliphatic epoxies such as cyclohexene oxide and the ERL™ and UVR™ series type of binders available from Dow Chemical, Midland, Mich., such as vinylcyclohexene oxide, vinylcyclohexene dioxide, 3,4-epoxycyclohexylmethyl-3,4-epoxycyclohexane carboxylate, bis-(3,4-epoxycyclohexyl) adipate and 2-(3,4-epoxycylclohexyl-5,5-spiro-3,4-epoxy) cyclohexene-meta-dioxane; also included are the glycidyl ether type epoxy binders such as propylene oxide, epichlorohydrin, styrene oxide, glycidol, the EPON, EPONEX, and HELOXY series type of epoxy binders available from Resolution Performance Products, Houston, Tex., including the diglycidyl either of bisphenol A and chain extended versions of this material such as EPON 828, EPON 1001, EPON 1004, EPON 1007, EPON 1009 and EPON 2002 or their equivalent from other manufacturers, EPONEX 1510, the hydrogenated diglycidyl either of bisphenol A, HELOXY 67, diglycidyl ether of 1,4-butanediol, HELOXY™ 107, diglycidyl ether of cyclohexane dimethanol, or their equivalent from other manufacturers, dicyclopentadiene dioxide, epoxidized vegetable oils such as epoxidized linseed and soybean oils available as VIKOLOX and VIKOFLEX binders from Atofina, Philadelphia, Pa., epoxidized KRATON LIQUID POLYMERS, such as L-207 available from Kraton Polymers, Houston, Tex., epoxidized polybutadienes such as the POLY BD binders from Atofina, Philadelphia, Pa., 1,4-butanediol diglycidyl ether, polyglycidyl ether of phenolformaldehyde, and for example DENTM epoxidized phenolic novolac binders such as DEN 431 and DEN 438 available from Dow Chemical Co., Midland Mich., epoxidized cresol novolac binders such as ARALDITE ECN 1299 available from Vantico AG, Basel, Switzerland, resorcinol diglycidyl ether, and epoxidized polystyrene/polybutadiene blends such as the Epofriendz binders such as EPOFRIEND A1010 available from Daicel USA Inc., Fort Lee, N.J., and resorcinol diglycidyl ether.

Higher molecular weight polyols include the polyethylene and polypropylene oxide polymers in the molecular weight (Mn) range of 200 to 20,000 such as the CARBOWAX polyethyleneoxide materials available from Dow Chemical Co., Midland, Mich., caprolactone polyols in the molecular weight range of 200 to 5,000 such as the TONE polyol materials available from Dow, polytetramethylene ether glycol in the molecular weight range of 200 to 4,000, such as the TERATHANE materials available from DuPont and POLYTHF 250 from BASF, polyethylene glycol, such as PEG™ 200 available from Dow, hydroxyl-terminated polybutadiene binders such as the POLY BD materials available from Atofina, Philadelphia, Pa., phenoxy binders such as those commercially available from Phenoxy Associates, Rock Hill, S. C., or equivalent materials supplied by other manufacturers.

It is also within the scope of this invention to include one or more epoxy binders which can be blended together. It is also within the scope of this invention to include one or more mono or poly-alcohols which can be blended together. The different kinds of binders and alcohols can be present in any proportion.

It is within the scope of this invention to use vinyl ether monomers as the cationically curable material. Vinyl ether-containing monomers can be methyl vinyl ether, ethyl vinyl ether, tert-butyl vinyl ether, isobutyl vinyl ether, triethyleneglycol divinyl ether (RAPT-CURE DVE-3, available from International Specialty Products, Wayne, N.J.), 1,4-cyclohexanedimethanol divinyl ether (RAPI-CURE CHVE, International Specialty Products), trimetylolpropane trivinyl ether (available from BASF Corp., Mount Olive, N.J.) and the VECTOMER divinyl ether binders from Morflex, Greensboro, N.C., such as VECTOMER 2010, VECTOMER 2020, VECTOMER 4010, and VECTOMER 4020, or their equivalent from other manufacturers. It is within the scope of this invention to use a blend of more than one vinyl ether binder.

It is also within the scope of this invention to use one or more epoxy binders blended with one or more vinyl ether binders. The different kinds of binders can be present in any proportion.

The preferred epoxy binders include the ERL and the UVR type of binders especially 3,4-epoxycyclohexylmethyl-3,4-epoxycyclohexanecarboxylate, bis-(3,4-epoxycyclohexyl) adipate and 2-(3,4-epoxycylclohexyl-5,5-spiro-3,4-epoxy) cyclohexene-meta-dioxane and the bisphenol A EPON type binders including 2,2-bis-p-(2,3-epoxypropoxy) phenylpropane and chain extended versions of this material and, binders of the type EPONEX 1510 and HELOXY 107 and 68. Also useful in the present invention are purified versions of these epoxies as described in U. S. Published Patent Application 2002/0022709 published 21 Feb. 2002.

When preparing compositions containing epoxy monomers, hydroxy-functional materials can be added. The hydroxyl-functional component can be present as a mixture or a blend of materials and can contain mono- and polyhydroxyl containing materials. Preferably, the hydroxy-functional material is at least a diol. When used, the hydroxyl-functional material can aid in chain extension and in preventing excess crosslinking of the epoxy during curing, e. g., increasing the toughness of the cured composition.

When present, useful hydroxyl-functional materials include aliphatic, cycloaliphatic or alkanol-substituted arene mono- or poly-alcohols having from about 2 to about 18 carbon atoms and two to five, preferably two to four hydroxy groups, or combinations thereof. Useful mono-alcohols can include methanol, ethanol, 1-propanol, 2-propanol, 2-methyl-2-propanol, 1-butanol, 2-butanol, 1-pentanol, neopentyl alcohol, 3-pentanol, 1-hexanol, 1-heptanol, 1-octanol, 2-phenoxyethanol, cyclopentanol, cyclohexanol, cyclohexylmethanol, 3-cyclohexyl-1-propanol, 2-norbornanemethanol and tetrahydrofurfuryl alcohol.

Polyols useful in the present invention include aliphatic, cycloaliphatic, or alkanol-substituted arene polyols, or mixtures thereof having from about 2 to about 18 carbon atoms and two to five, preferably two to four hydroxyl groups. Examples of useful polyols include 1,2-ethanediol, 1,2-propanediol, 1,3-propanediol, 1,4-butanediol, 1,3-butanediol, 2-methyl-1,3-propanediol, 2,2-dimethyl-1,3-propanediol, 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, sorbitol, diethylene glycol, triethylene glycol, tetraethylene glycol, glycerine, 2-ethyl-2-(hydroxymethyl)-1,3-propanediol, 2-ethyl-1,3-pentanediol, 1,4-cyclohexanedimethanol, 1,4-benzene-dimethanol and polyalkoxylated bisphenol A derivatives. Other examples of useful polyols are disclosed in U.S. Pat. No. 4,503,211.

Bi-functional monomers having both cationically polymerizable and free-radically polymerizable moieties in the same monomer are useful in the present invention, such as, for example, glycidyl methacrylate, or 2-hydroxyethyl acrylate.

It is also within the scope of this invention to add a free radically polymerizable monomer, such as an acrylate or methacrylate. The addition of such a monomer broadens the scope of obtainable physical properties and processing options. When two or more polymerizable monomers are present, they can be present in any proportion.

Suitable cationic photoinitiators are selected from organic onium cations, for example those described in photoinitiators for Free Radical Cationic & Anionic Photopolymerization, 2nd Edition, J. V. Crivello & K. Dietliker, John Wiley and Sons, 1998, pp. 275 to 298, and U.S. Pat. Nos. 4,250,311, 3,708,296, 4,069,055, 4,216,288, 5,084,586 and 5,124,417 and such descriptions incorporated herein by reference, including aliphatic or aromatic Group IVA-VIIA (CAS version) centered onium salts, preferably I-, S-, P- and C-centered onium salts, such as those selected from sulfoxonium, diaryliodonium, triarylsulfonium, carbonium and phosphonium, and most preferably I-, and S-centered onium salts, such as those selected from sulfoxonium, diaryliodonium, and triarylsulfonium, wherein "aryl" means an unsubstituted or substituted aromatic moiety having up to four independently selected substituents.

The quantum dot layer can have any useful amount of quantum dots, and in some embodiments the quantum dot layer can include from 0.1 wt % to 1 wt % quantum dots, based on the total weight of the quantum dot layer (dots and polymeric binder). In some embodiments, the stabilized quantum dots are added to the fluid carrier in amounts such that the optical density is at least 10, optical density defined as the absorbance at 440 nm for a cell with a path length of 1 cm) solution.

The dispersion composition can also contain a surfactant (i.e., leveling agent), a polymerization initiator, and other additives, as known in the art.

Generally, the stabilizing additive, quantum dots, optional surface-modifying ligand, the polymeric binder and carrier fluids (polymeric or non-polymeric) are combined and subject to high shear mixing to produce a dispersion. The polymeric binder is chosen such that there is limited compatibility and the carrier fluid form a separate, non-aggregating phase in the polymeric binder. The dispersion, comprising droplets of carrier fluid containing the nanoparticles and stabilizing additive dispersed in the polymeric binder, is then coated and cured either thermally, free-radically, or both to lock in the dispersed structure and exclude oxygen and water from the dispersed quantum dots.

The curable composition comprising a free radically polymerizable polymeric binder may be irradiated with activating UV or visible radiation to polymerize the components preferably in the wavelengths of 250 to 500 nanometers. UV light sources can be of two types: 1) relatively low light intensity sources such as blacklights that provide generally 10 mW/cm$^2$ or less (as measured in accordance with procedures approved by the United States National Institute of Standards and Technology as, for example, with a UVIMAP™ UM 365 L-S radiometer manufactured by Electronic Instrumentation & Technology, Inc., in Sterling, Va.) over a wavelength range of 280 to 400 nanometers and 2) relatively high light intensity sources such as medium- and high-pressure mercury arc lamps, electrodeless mercury lamps, light emitting diodes, mercury-xenon lamps, lasers and the like, which provide intensities generally between 10 and 5000 mW/cm$^2$ in the wavelength rages of 320-390 nm (as measured in accordance with procedures approved by the United States National Institute of Standards and Technology as, for example, with a PowerPuck™ radiometer manufactured by Electronic Instrumentation & Technology, Inc., in Sterling, Va.).

Referring to FIG. 1, quantum dot article 10 includes a first barrier layer 32, a second barrier layer 34, and a quantum dot layer 20 between the first barrier layer 32 and the second barrier layer 34. The quantum dot layer 20 includes a plurality of quantum dots 22 dispersed in a polymeric binder 24, which may be cured or uncured.

The quantum dot layer can have any useful amount of quantum dots. In some embodiments, the quantum dots are added to the fluid carrier in amounts such that the optical density is at least 10, optical density defined as the absorbance at 440 nm for a cell with a path length of 1 cm) solution.

The barrier layers 32, 34 can be formed of any useful material that can protect the quantum dots 22 from exposure to environmental contaminates such as, for example, oxygen, water, and water vapor. Suitable barrier layers 32, 34 include, but are not limited to, films of polymers, glass and dielectric materials. In some embodiments, suitable materials for the barrier layers 32, 34 include, for example, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof.

More particularly, barrier films can be selected from a variety of constructions. Barrier films are typically selected such that they have oxygen and water transmission rates at a specified level as required by the application. In some embodiments, the barrier film has a water vapor transmission rate (WVTR) less than about 0.005 $g/m^2/day$ at 38° C. and 100% relative humidity; in some embodiments, less than about 0.0005 $g/m^2/day$ at 38° C. and 100% relative humidity; and in some embodiments, less than about 0.00005 $g/m^2/day$ at 38° C. and 100% relative humidity. In some embodiments, the flexible barrier film has a WVTR of less than about 0.05, 0.005, 0.0005, or 0.00005 $g/m^2/day$ at 50° C. and 100% relative humidity or even less than about 0.005, 0.0005, 0.00005 $g/m^2/day$ at 85° C. and 100% relative humidity. In some embodiments, the barrier film has an oxygen transmission rate of less than about 0.005 $g/m^2/day$ at 23° C. and 90% relative humidity; in some embodiments, less than about 0.0005 $g/m^2/day$ at 23° C. and 90% relative humidity; and in some embodiments, less than about 0.00005 $g/m^2/day$ at 23° C. and 90% relative humidity.

Exemplary useful barrier films include inorganic films prepared by atomic layer deposition, thermal evaporation, sputtering, and chemical vapor deposition. Useful barrier films are typically flexible and transparent. In some embodiments, useful barrier films comprise inorganic/organic. Flexible ultra-barrier films comprising inorganic/organic multilayers are described, for example, in U.S. Pat. No. 7,018,713 (Padiyath et al.). Such flexible ultra-barrier films may have a first polymer layer disposed on polymeric film substrate that is overcoated with two or more inorganic barrier layers separated by at least one second polymer layer. In some embodiments, the barrier film comprises one inorganic barrier layer interposed between the first polymer layer disposed on the polymeric film substrate and a second polymer layer 224.

In some embodiments, each barrier layer 32, 34 of the quantum dot article 10 includes at least two sub-layers of different materials or compositions. In some embodiments, such a multi-layered barrier construction can more effectively reduce or eliminate pinhole defect alignment in the barrier layers 32, 34, providing a more effective shield against oxygen and moisture penetration into the cured polymeric binder 24. The quantum dot article 10 can include any suitable material or combination of barrier materials and any suitable number of barrier layers or sub-layers on either or both sides of the quantum dot layer 20. The materials, thickness, and number of barrier layers and sub-layers will depend on the particular application, and will suitably be chosen to maximize barrier protection and brightness of the quantum dots 22 while minimizing the thickness of the quantum dot article 10. In some embodiments each barrier layer 32, 34 is itself a laminate film, such as a dual laminate film, where each barrier film layer is sufficiently thick to eliminate wrinkling in roll-to-roll or laminate manufacturing processes. In one illustrative embodiment, the barrier layers 32, 34 are polyester films (e.g., PET) having an oxide layer on an exposed surface thereof.

The quantum dot layer 20 can include one or more populations of quantum dots or quantum dot materials 22. Exemplary quantum dots or quantum dot materials 22 emit green light and red light upon down-conversion of blue primary light from a blue LED to secondary light emitted by the quantum dots. The respective portions of red, green, and blue light can be controlled to achieve a desired white point for the white light emitted by a display device incorporating the quantum dot article 10. Exemplary quantum dots 22 for use in the quantum dot articles 10 include, but are not limited to, InP with ZnS shells. Suitable quantum dots for use in quantum dot articles described herein include, but are not limited to, core/shell fluorescent nanocrystals including CdSe/ZnS, InP/ZnS, PbSe/PbS, CdSe/CdS, CdTe/CdS or CdTe/ZnS.

In exemplary embodiments, the nanoparticles include a stabilizing additive, fluid carrier and are dispersed in a cured polymeric binder. Quantum dot and quantum dot materials 22 are commercially available from, for example, Nanosys Inc., Milpitas, Calif.

In one or more embodiments the quantum dot layer 20 can optionally include scattering beads or particles. These scattering beads or particles have a refractive index that differs from the refractive index of the cured polymeric binder 24 by at least 0.05, or by at least 0.1. These scattering beads or particles can include, for example, polymers such as silicone, acrylic, nylon, and the like, or inorganic materials such as $TiO_2$, $SiO_x$, $AlO_x$, and the like, and combinations thereof. In some embodiments, including scattering particles in the quantum dot layer 20 can increase the optical path length through the quantum dot layer 20 and improve quantum dot absorption and efficiency. In many embodiments, the scattering beads or particles have an average particle size from 1 to 10 micrometers, or from 2 to 6 micrometers. In some embodiments, the quantum dot material 20 can optionally include fillers such fumed silica.

In some preferred embodiments, the scattering beads or particles are Tospearl™ 120A, 130A, 145A and 2000B spherical silicone resins available in 2.0, 3.0, 4.5 and 6.0 micron particle sizes respectively from Momentive Specialty Chemicals Inc., Columbus, Ohio.

The cured polymeric binder 24 of the quantum dot layer 20 can be formed from a polymeric binder or binder precursor that adheres to the materials forming the barrier layers 32, 34 to form a laminate construction, and also forms a protective matrix for the quantum dots 22. In one embodiment, the cured polymeric binder 24 is formed by curing an epoxy amine polymer and an optional radiation-curable methacrylate compound.

Figure 2:
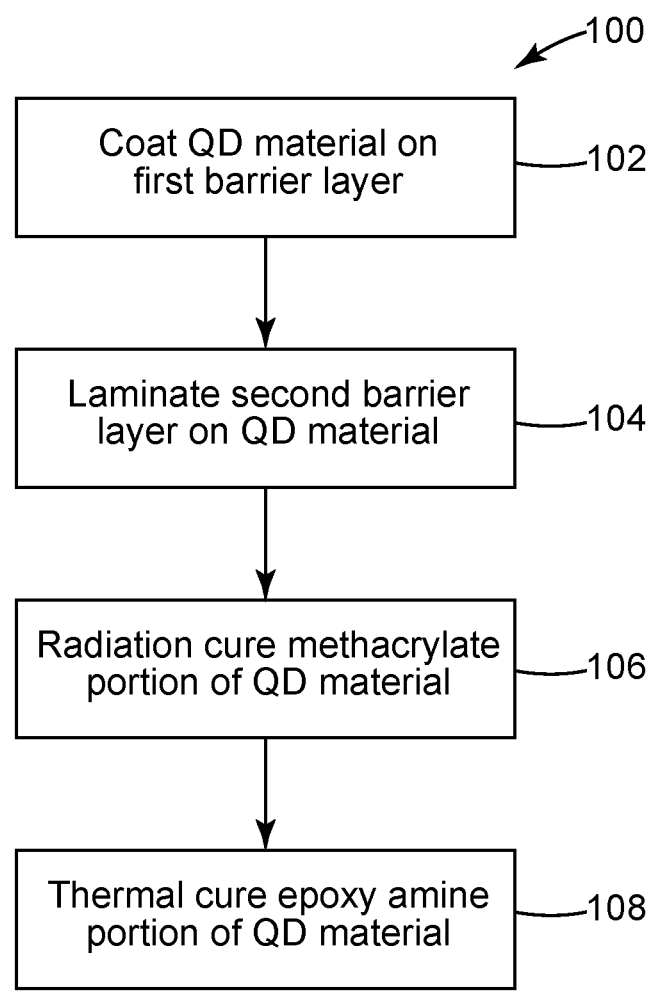
FIG. 2 is a flow diagram of an illustrative method of forming a quantum dot film.

Referring to FIG. 2, in another aspect, the present disclosure is directed to a method of forming a quantum dot film article 100 including coating a polymeric binder composition including quantum dots on a first barrier layer 102 and disposing a second barrier layer on the quantum dot material 104. In some embodiments, the method 100 includes polymerizing (e.g., radiation curing) the radiation curable (meth) acrylate compound to form a partially cured quantum dot material 106.

In some embodiments, the binder composition can be cured or hardened by heating. In other embodiments, the binder composition may also be cured or hardened by applying radiation such as, for example, ultraviolet (UV) light. Curing or hardening steps may include UV curing, heating, or both. In some example embodiments that are not intended to be limiting, UV cure conditions can include applying about 10 mJ/cm$^2$ to about 4000 mJ/cm$^2$ of UVA, more preferably about 10 mJ/cm$^2$ to about 1000 mJ/cm$^2$ of UVA. Heating and UV light may also be applied alone or in combination to increase the viscosity of the binder composition, which can allow easier handling on coating and processing lines.

In some embodiments, the binder composition may be cured after lamination between the overlying barrier films 32, 34. Thus, the increase in viscosity of the binder composition locks in the coating quality right after lamination. By curing right after coating or laminating, in some embodiments the cured binder increases in viscosity to a point that the binder composition acts as a pressure sensitive adhesive (PSA) to hold the laminate together during the cure and greatly reduces defects during the cure. In some embodiments, the radiation cure of the binder provides greater control over coating, curing and web handling as compared to traditional thermal curing.

Once at least partially cured, the binder composition forms polymer network that provides a protective supporting cured polymeric binder 24 for the quantum dots 22.

Ingress, including edge ingress, is defined by a loss in quantum dot performance due to ingress of moisture and/or oxygen into the cured polymeric binder 24. In various embodiments, the edge ingress of moisture and oxygen into the cured binder 24 is less than about 1.25 mm after 1 week at 85° C., or about less than 0.75 mm after 1 week at 85° C., or less than about 0.5 mm after 1 week at 85° C. In various embodiments, oxygen permeation into the cured polymeric binder is less than about 80 (cc·mil)/(m$^2$day), or less than about 50 (cc·mil)/(m$^2$day). In various embodiments, the water vapor transmission rate of the cured polymeric binder should be less than about 15 (20 g/m$^2$·mil·day), or less than about 10 (20 g/m$^2$·mil·day).

In various embodiments, the thickness of the quantum dot layer 20 is about 80 microns to about 250 microns.

Figure 3:
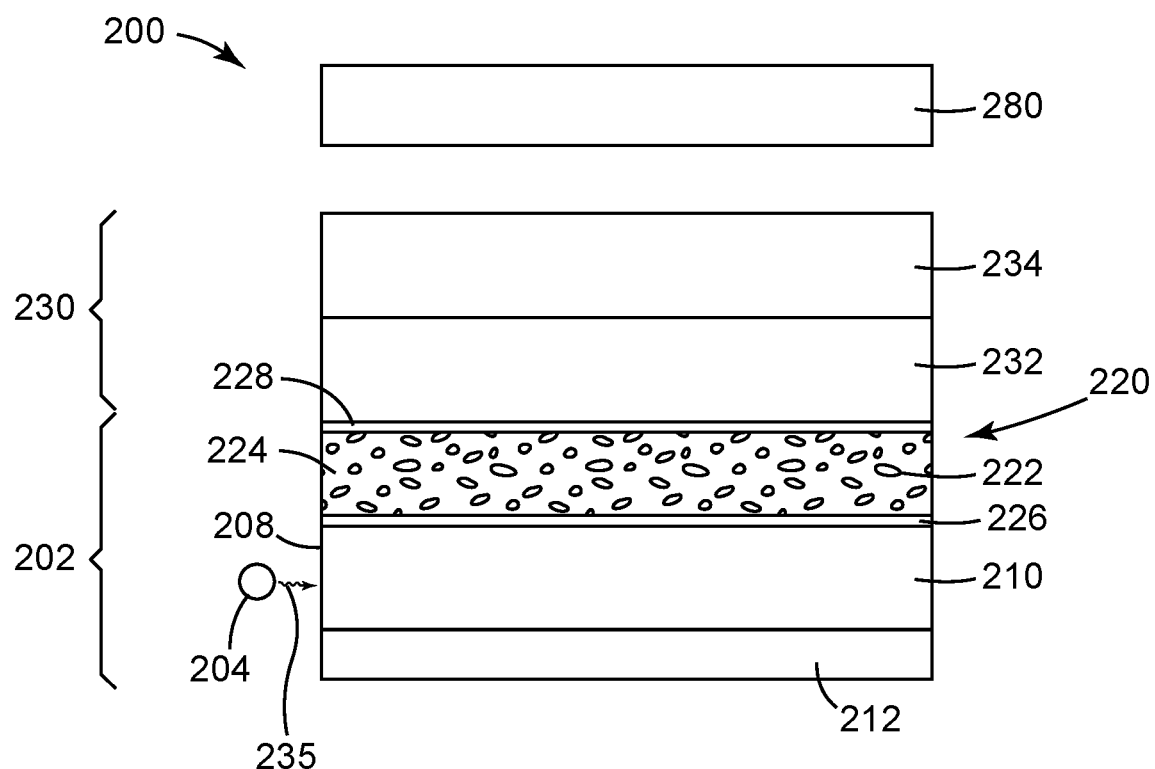
FIG. 3 is a schematic illustration of an embodiment of a display including a quantum dot article.

FIG. 3 is a schematic illustration of an embodiment of a display device 200 including the quantum dot articles described herein. This illustration is merely provided as an example and is not intended to be limiting. The display device 200 includes a backlight 202 with a light source 204 such as, for example, a light emitting diode (LED). The light source 204 emits light along an emission axis 235. The light source 204 (for example, a LED light source) emits light through an input edge 208 into a hollow light recycling cavity 210 having a back reflector 212 thereon. The back reflector 212 can be predominately specular, diffuse or a combination thereof, and is preferably highly reflective. The backlight 202 further includes a quantum dot article 220, which includes a protective binder 224 having dispersed therein quantum dots 222. The protective cured polymeric binder 224 is bounded on both surfaces by polymeric barrier films 226, 228, which may include a single layer or multiple layers.

The display device 200 further includes a front reflector 230 that includes multiple directional recycling films or layers, which are optical films with a surface structure that redirects off-axis light in a direction closer to the axis of the display, which can increase the amount of light propagating on-axis through the display device, this increasing the brightness and contrast of the image seen by a viewer. The front reflector 230 can also include other types of optical films such as polarizers. In one non-limiting example, the front reflector 230 can include one or more prismatic films 232 and/or gain diffusers. The prismatic films 232 may have prisms elongated along an axis, which may be oriented parallel or perpendicular to an emission axis 235 of the light source 204. In some embodiments, the prism axes of the prismatic films may be crossed. The front reflector 230 may further include one or more polarizing films 234, which may include multilayer optical polarizing films, diffusely reflecting polarizing films, and the like. The light emitted by the front reflector 230 enters a liquid crystal (LC) panel 280. Numerous examples of backlighting structures and films may be found in, for example, U.S. 2011/0051047.

The following examples are provided to further illustrate the present invention and are not intended to limit the invention in any manner.

EXAMPLES

All materials were obtained from commercial sources and used as received.

TABLE 1

Materials

| Designation | Description | Source |
|---|---|---|
| TPP | Triphenylphosphine | Alfa Aesar, Ward Hill, MA |
| SbPh$_3$ | Triphenylantimony | Sigma Aldrich, St. Louis, MO |
| DPPM | Bis(diphenylphosphino)methane | Alfa Aesar, Ward Hill, MA |
| DPPE | 1,2-Bis(diphenylphosphino)ethane | TCI, Tokyo, Japan |
| DPPP | 1,3-Bis(diphenylphosphino)propane | Strem Chemical, Newburyport, MA |
| TOP | Trioctylphosphine | Strem Chemical, Newburyport, MA |
| TOPO | Trioctylphosphine oxide | Strem Chemical, Newburyport, MA |
| P(CH$x$)$_3$ | Tricyclohexylphosphine | Alfa Aesar, Ward Hill, MA |
| Green InP/Octadecene | InP/ZnS quantum dot material obtained from Nanosys, and used as received | Nanosys, Milpitas, CA |
| Green InP/silicone | InP/ZnS quantum dot material dispersed in silicone carrier fluid, having an optical density of 25, as described in U.S. Patent Application 2010/0276638 | Nanosys, Milpitas, CA |

TABLE 1-continued

Materials

| Designation | Description | Source |
|---|---|---|
| Green InP/heptane | InP/ZnS quantum dot material in heptane obtained from Nanosys, and used as received | Nanosys, Milpitas, CA |
| Red InP/silicone | InP/ZnS quantum dot material dispersed in silicone carrier fluid, having an optical density of 25, as described in U.S. Patent Application 2010/0276638 | Nanosys, Milpitas, CA |
| 2 mil barrier film | A 2 mil (~51 micrometer) barrier film available as "FTB-M-50" from 3M Co., St. Paul, MN | 3M Company, St. Paul MN |
| TPO-L | Ethyl (2,4,6-trimethylbenzoyl) phenylphosphinate, a liquid photoinitiator available under the trade designation "IRGACURE TPO-L" | BASF Resins, Wyandotte, MI |
| CN2003B | A modified epoxy acrylate available under the trade designation "CN2003B" | Sartomer USA, LLC, Exton, PA |
| SR833 S | A tricyclodecane dimethanol diacrylate available under the trade designation "SR833 S" | Sartomer USA, LLC, Exton, PA |

Test Methods

A CARY 60 UV-Vis spectrometer was used to measure the UV-VIS spectrum of the quantum dot samples.

Quantum Yield Measurements:

Fluorescence cells were from NSG Precision Cells.

Quantum yield measurements were made on a HAMAMATSU ABSOLUTE PL QUANTUM YIELD SPECTROMETER C11347, available from Hamamatsu Photonics, Hamamatsu, JP. An excitation wavelength of 440 nm was used for all measurements. A built-in program was used to analyze the emission spectra to calculate the desired spectral quantities. A built-in correction program was used to correct the emission spectra for self-absorption to give corrected quantum yields. The peak position was determined for the peak maximum in the corrected spectra curve.

Percent Light Transmission (% T)

Percent light transmission (% T) was measured using a BYK HAZEGUARD PLUS (Columbia, Md.). All quantum yields (EQE) were measured by using an absolute PL QUANTUM YIELD SPECTROMETER C11347 (Hamamatsu Corporation, Middlesex, N.J.).

White Point (Color)

White point (color) was quantified by placing the constructed QDEF film into a recycling system (FIG. 4) and measuring with a colorimeter (available from Photo Research, Inc., Chatsworth, Calif., under the trade designation "PR650"). A gain cube with a blue LED light was used with the QDEF film, which contained red and green quantum dots, and a micro-replicated brightness enhancement film (available from 3M, St. Paul, Minn., under the trade designation "VIKUITI BEF"). A white point was achieved in the recycling system shown in FIG. 4.

Color was quantified by placing the constructed film 310 into a recycling system 300 (FIG. 4) and measuring with a colorimeter 302 available from Photo Research, Inc., Chatsworth, Calif., under the trade designation PR650. A gain cube 304 with a blue LED light was used with the film 310, which contained red and green quantum dots, and a micro-replicated brightness enhancement film 308 available from 3M, St. Paul, Minn., under the trade designation VIKUITI BEF. A white point was achieved in this recycling system.

Figure 4:
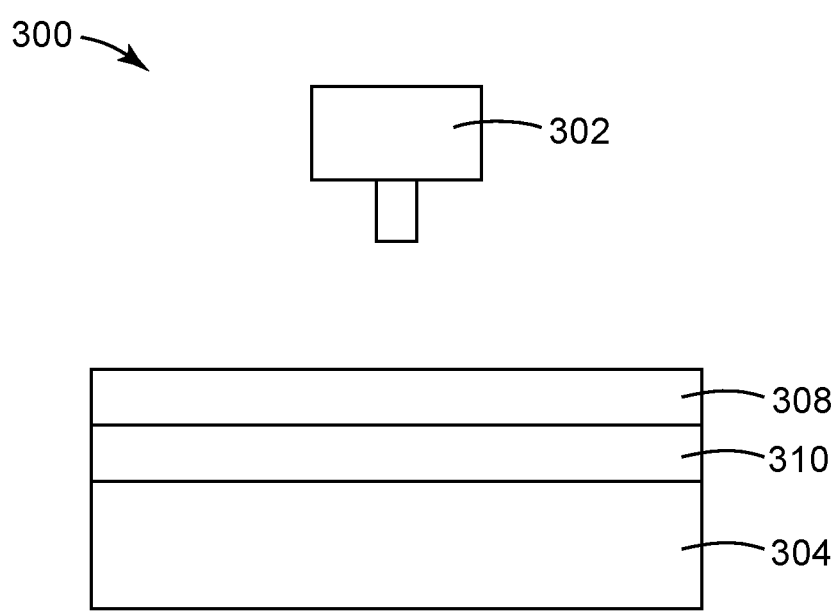
FIG. 4 illustrates the white point (color) measurement system.

Color was measured: (1) after a duration of operation at 85° C. and 152 watts/stradian/m2; (2) after a duration of incubation at 65° C./95% RH, and (3) after a duration of incubation at 85° C. as illustrated in FIG. 4.

An initial white point after film construction was measured and quantified using the CIE1931 (x,y) convention. It is ideal for QDEF to maintain the same color during long-term operation. Most of the photo-enhancement was observed in the first 10-20 hours in a device or aging at 85° C. The effect was irreversible.

Examples 1 to 7 (EX-1 to EX-7): Stabilizing Additive Performance

Quantum dot solutions were prepared in a MBRAUN LABMASTER SP glove box workstation under argon atmosphere.

Specified amounts of the stabilizing additive that could be handled in air were weighed out in the glass vials before entering the glove box workstation. All containers and equipment to be used in a test were placed in the antechamber of the glove box and pumped on for at least 15 minutes before starting an automatic pump/refill cycle used to bring items into the glove box.

Once in the glove box, stabilizing additive that had to be handled under inert atmosphere were weighed out into the appropriate glass vials. Then 10 milliliters of toluene was pipetted into each vial along with a toluene blank that would not have any quantum dot materials added, and a vial that contained no additional stabilizing additive as a control example (CE-1). The solution in each vial was hand stirred to ensure that all of the additive/ligands had dissolved. Then 50 microliters of a InP/Green/Octadecene quantum dot solution was added, and followed by hand stirring. Four (4) milliliters of each test solution was pipetted into a separate fluorescence cell. Each fluorescence cell was sealed with a rubber septum, and the sealed cells were removed from the glove box to make quantum yield measurements. A built-in program was used to analyze the emission spectra to calculate the desired spectral quantities. A built-in correction program was used to correct the emission spectra for self-absorption to give corrected quantum yields. The peak position was determined for the peak maximum in the corrected spectra curve. Results of the quantum yield measurements were as summarized in Table 2.

TABLE 2

| Example | Additive | Amount of Additive, mg | Quantum Yield (Corrected) | Peak Wavelength (nm) | Peak FWHM* (nm) |
|---|---|---|---|---|---|
| CE-1 | None | N/A | 0.79 | 530 | 42.1 |
| CE-2 | TPP | 10.8 mg | 0.84 | 530 | 42.1 |
| CE-3 | SbPh$_3$ | 10.1 | 0.84 | 530 | 42.1 |
| EX-1 | DPPM | 9.9 | 0.84 | 528 | 42.1 |
| EX-2 | DPPE | 10.4 | 0.82 | 530 | 42.1 |
| CE-4 | P(CHx)$_3$ | 10.7 | 0.71 | 530 | 42.2 |
| CE-5 | TOPO | 10.0 | 0.70 | 530 | 43.4 |
| CE-6 | TOP | 10.2 | 0.76 | 529 | 42.9 |

*FWHM = full width half-maximum

Preparation of Quantum Dot Concentrate (Solution A)

A quantum dot concentrate, termed "Solution A", was prepared using InP quantum dots in silicone using the relative amounts shown in Table 3.

TABLE 3

| Solution A | |
|---|---|
| Material | Weight percent |
| Green InP/silicone, optical density = 25 | 81.82 |
| Red InP/silicone, optical density = 25 | 18.18 |

Preparation of Polymeric Acrylate Binder Formulation (Solution B)

To prepare an acrylate binder formulation, termed "Solution B", the components shown in Table 4 were combined and mixed until uniform.

TABLE 4

| Solution B | |
|---|---|
| Material | Weight percent |
| CN2003B | 49.7 |
| SR833 S | 49.7 |
| TPO-L | 0.7 |

Preparation of Quantum Dot Concentrate Including Triphenylphosphine (Solution C)

A quantum dot concentrate, termed "Solution C", was prepared by combining InP quantum dots in silicone carrier fluid and triphenylphosphine (TPP) stabilizing additive, according to the amounts shown in Table 5, and heated at 80° C. for 10 minutes with stirring.

TABLE 5

| Solution C | |
|---|---|
| Material | Weight percent |
| Green InP in silicone at optical density = 25 | 80.82 |
| Red InP in silicone at optical density = 25 | 17.18 |
| TPP | 2.00 |

Comparative Example 7 (CE-7): Preparation of QDEF Using Acrylate Binder and InP Quantum Dots in Silicone (No Added Triphenylphosphine)

Quantum dot concentrate (Solution A) was added to acrylate binder (Solution B) in a relative amount of 16.0 weight percent of Solution A and 84.0 weight percent of Solution B. The solution of dot concentrate and binder was mixed with a Cowles-blade mixer for 3 minutes at 1400 rpm. This mixture was coated between two 2 mil (~51 micrometer) barrier films at a thickness of 100 micrometers using a knife coater. The coatings were then cured with ultraviolet (UV) radiation using a CLEARSTONE UV LED lamp at 385 nm for 60 seconds.

Comparative Example 8 (CE-8): Preparation of QDEF Using Acrylate Matrix and InP Quantum Dots in Silicone, with Added Triphenylphosphine Dot concentrate solution (Solution C) was added to the acrylate polymeric binder (Solution B) in a relative amount of 16.0 weight percent of Solution C and 84.0 weight percent of Solution B. The solution of dot concentrate and binder was mixed with a cowls-blade mixer for 3 minutes at 1400 rpm. This mixture was coated between two 2 mil (~51 micrometer) barrier films at a thickness of 100 micrometers using a knife coater. The coatings were then cured with ultraviolet (UV) radiation using a CLEARSTONE UV LED lamp at 385 nm for 60 seconds.

Coatings were tested initially, after 1 week of aging at 85° C., and after 1 week of aging in a lifetime screening box (aged at a temperature of 85° C. and a light intensity of 152 watts/steradian/m$^2$). Initial test results were as summarized in Table 6; test results after aging 1 week at 85° C. were as summarized in Table 7; and test results after aging one week at 85° C. and with a light intensity of 152 watts/steradian/m$^2$ were as summarized in Table 8.

TABLE 6

| | | | | | | Luminance | | | |
|---|---|---|---|---|---|---|---|---|---|
| Sample | Binder solution | Quantum dot concentrate | % T | Haze | Clarity | (candela/m$^2$) | X | Y | EQE |
| CE-7 | B | InP in silicone (Solution A) | 81.9 | 101 | 4.4 | 303.6 | 0.2416 | 0.2207 | 72% |
| CE-8 | B | InP in silicone plus 2 wt. % TPP (Solution C) | 82.4 | 101 | 5.1 | 288.3 | 0.2443 | 0.2204 | 70% |

TABLE 7

Aged one week at 85° C.

| Sample | Binder | Qdot concentrate | Δ Luminance, as a percentage | Δ X, Y | Δ EQE, as a percentage |
|---|---|---|---|---|---|
| CE-7 | Solution B | InP in silicone (Solution A) | −12.8 | 0.019 | −6.4 |
| CE-8 | Solution B | InP in silicone plus 2 wt. % TPP (Solution C) | −4.3 | 0.007 | −5.1 |

TABLE 8

Aged one week at 85° C. and with a light intensity of 152 watts/steradian/m²

| Sample | Binder | Qdot concentrate | Δ Luminance, as a percentage | Δ X | Δ Y | Δ X, Y |
|---|---|---|---|---|---|---|
| CE-7 | Solution B | InP in silicone (Solution A) | −40.3% | −0.010 | −0.080 | 0.08 |
| CE-8 | Solution B | InP in silicone plus 2 wt. % TPP (Solution C) | −39.8% | 0.010 | −0.080 | 0.08 |

Example 3-5: Stability to Light Exposure of InP Quantum Dots

Preparation of quantum dot solutions (with and without the stabilizing additive) and measurement of quantum yields followed the same procedure as demonstrated in examples 1 to 7. Green InP/heptane concentrate was used in this experiment. The solutions were irradiated for two hours using two Philips TLD bulbs having a spectral output centered 420 nm. Quantum yield of the irradiated solutions were then measured. Table 9 compares the change in quantum yield of InP solutions upon irradiation.

TABLE 9

| Example | Additive | Amount (mg) | Quantum yield Before irradiation | Quantum yield After irradiation | Change in quantum yield |
|---|---|---|---|---|---|
| CE-9 | No additive | N/A | 0.575 | 0.358 | −38% |
| CE-10 | TPP | 10.3 | 0.727 | 0.657 | −10% |
| Ex-3 | DPPM | 10.2 | 0.722 | 0.618 | −14% |
| Ex-4 | DPPE | 9.8 | 0.731 | 0.632 | −14% |
| Ex-5 | DPPP | 10.5 | 0.729 | 0.691 | −5% |

This Disclosure Provides the Following Embodiments:

Embodiment 1 is a composite particle comprising: a fluorescent semiconductor core/shell nanoparticle; and a stabilizing additive combined with the core/shell nanoparticle, the additive/ligands of the formula:

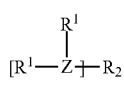

$$[R^1-Z \!\!+\!\! R_2]$$
$$a = 1, 2$$

I

Embodiment 2 is the composite particle of embodiment 1, wherein subscript a is 2, and $R^2$ is a divalent hydrocarbyl group.

Embodiment 3 is the composite particle of embodiment 1, wherein subscript a is 1 or 2, and Z is selected from Sb or As.

Embodiment 4 is the composite particle of any of embodiments 1-3 dispersed in a fluid carrier.

Embodiment 5 is the composite particle of any of embodiments 1-4 wherein the core comprises a first semiconductor material and the shell comprises a second semiconductor material that is different than the first semiconductor material.

Embodiment 6 is the composite particle of any of embodiments 1-4 wherein the core comprises a metal phosphide or a metal selenide.

Embodiment 7 is the composite particle of any of embodiments 1-4 wherein the core comprises InP or CdSe.

Embodiment 8 is the composite particle of any of any of embodiments 1-4 wherein the shell comprises a zinc-containing compound.

Embodiment 9 is the composite particle of any of the previous embodiments wherein the shell is a multilayered shell.

Embodiment 10 is the composite particle of embodiment 9 wherein the multilayered shell comprises an inner shell overcoating the core, wherein the inner shell comprises zinc selenide and zinc sulfide.

Embodiment 11 is the composite particle of embodiment 10 wherein the multilayered shell comprises an outer shell overcoating the inner shell, wherein the outer shell comprises zinc sulfide.

Embodiment 12 is the composite particle of any of embodiments 1 through 11 wherein the stabilizing additive is soluble in a carrier fluid at room temperature in an amount of at least 0.1 wt-%, preferably at least 1 wt. %.

Embodiment 13 is the composite particle comprising: a fluorescent semiconductor core/shell nanoparticle comprising: an InP core; an inner shell overcoating the core, wherein the inner shell comprises zinc selenide and zinc sulfide; and an outer shell overcoating the inner shell, wherein the outer shell comprises zinc sulfide; and a stabilizing additive of any of embodiments 1-4.

Embodiment 14 is a quantum dot film article comprising:
a first barrier layer;
a second barrier layer; and
a quantum dot layer between the first barrier layer and the second barrier layer, the quantum dot layer comprising the composite particles of any of embodiments 4-13 dispersed in a polymeric binder.

Embodiment 15 is the article of embodiment 14 wherein the quantum dots layer comprises droplets of the composite particles dispersed in a polymeric or non-polymeric carrier fluid, the droplets dispersed in the polymeric binder.

Embodiment 16 is the article of any one of embodiments 14-15, wherein the polymeric binder composition further comprises a photoinitator.

Embodiment 17 is the article of any one of embodiments 14-16, wherein the polymeric binder further comprises scattering particles having an average size in a range from 1 to 10 micrometers.

Embodiment 18 is the article of any one of embodiments 14-17, wherein at least one of the first and the second barrier layer comprises at least one polymeric film.

Embodiment 19 is a display device comprising the film article of any one of embodiments 14-18.

Embodiment 20 is a method of forming an article, comprising coating a composite particle of any of embodiments 4-13 on a first polymeric film, the composite particles in a polymeric binder composition comprising a radiation curable methacrylate compound, and a photoinitiator.

Embodiment 21 is the method of embodiment 20 wherein the composite particles of embodiments 4-13 are dispersed in droplets of a carrier fluid or polymeric carrier, the droplets dispersed in the polymeric binder.

Embodiment 22 is the method of embodiments 20-21, further comprising curing the binder composition.

Embodiment 23 is the method of embodiments 20-22, further comprising applying a second polymeric film on the binder composition.

Embodiment 24 is the composite particle of embodiments 1-13 further comprising a surface-modifyingligand bound to the surface of the nanoparticle of the formula $R^5$-$R^{12}(X)_n$.

Embodiment 25 is the composition of composite particle comprising: a fluorescent semiconductor core/shell nanoparticle comprising: an InP core; an inner shell overcoating the core, wherein the inner shell comprises zinc selenide and zinc sulfide; and an outer shell overcoating the inner shell, wherein the outer shell comprises zinc sulfide; a stabilizing additive of embodiments 1-3, the nanoparticles dispersed in a silicone carrier and an acrylate binder.

Embodiment 26 is the composition of embodiment 25 wherein the acrylate resin binder is an epoxy acrylate oligomer binder.

What is claimed is:

1. A composite particle comprising a fluorescent core/shell InP nanoparticle and
a stabilizing additive of the formula:

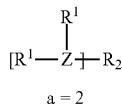

wherein $R^1$ is hydrocarbyl group selected from alkyl, aryl, alkaryl and aralkyl, and at least one of said $R^1$ groups is an aryl or alkaryl group;
$R^2$ a divalent hydrocarbyl group;
Z is P, As or Sb.

2. The composite particle of claim 1 wherein at least two of said $R^1$ groups are an aryl or alkaryl group.

3. The composite particle of claim 1 wherein $R^1$ is phenyl.

4. The composite particle of claim 1 wherein $R^1$ is $C_1$-$C_4$ alkylene.

5. The composite particle of claim 1 further comprising a surface modifying ligand bound to the surface of the nanoparticle of the formula:

$R^5$—$R^{12}(X)_n$ wherein
$R^5$ is (hetero)hydrocarbyl group having $C_2$ to $C_{30}$ carbon atoms;

$R^{12}$ is a hydrocarbyl group including alkylene, arylene, alkarylene and aralkylene;
n is at least one;
X is a ligand group selected from —$CO_2H$, —$SO_3H$, —P(O)(OH), —OP(O)(OH), —OH and —$NH_2$.

6. The composite particle of claim 1 wherein the shell comprises a magnesium or zinc-containing compound.

7. The composite particle of claim 1 wherein the shell is a multilayered shell.

8. The composite particle of claim 7 wherein the multilayered shell comprises an inner shell overcoating the core, wherein the inner shell comprises zinc selenide and zinc sulfide.

9. The composite particle of claim 7 wherein the multilayered shell comprises an outer shell overcoating the inner shell, wherein the outer shell comprises zinc sulfide or MgS.

10. The composite particle of claim 1 comprising:
a fluorescent semiconductor core/shell nanoparticle comprising:
an InP core;
an inner shell overcoating the core, wherein the inner shell comprises zinc selenide and zinc sulfide; and
an outer shell overcoating the inner shell, wherein the outer shell comprises zinc sulfide; and
a stabilizing additive of the formula:

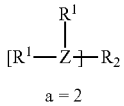

wherein $R^1$ is alkyl, aryl, alkaryl and aralkyl;
$R^2$ a divalent hydrocarbyl group;
Z is P, As or Sb.

11. A composition comprising the composite particle of claim 1 and a polymeric binder.

12. A composition comprising the composite particle of claim 1 dispersed in droplets of a carrier fluid, said droplets dispersed in a polymeric binder.

13. The composition of claim 11 wherein the polymeric binder comprises polysiloxanes, fluoroelastomers, polyamides, polyimides, polycaprolactones, polycaprolactams, polyurethanes, polyvinyl alcohols, polyvinyl chlorides, polyvinyl acetates, polyesters, polycarbonates, polyacrylates, polymethacrylates, polyacrylamides, and polymethacrylamides.

14. The composition of claim 11 wherein the binder comprises a cationically curable polymeric binder.

15. An article comprising the composite particle of claim 1 dispersed in the cured polymeric binder between two barrier films.

16. The article of claim 15 wherein the composite particle is dispersed in droplets of a carrier fluid, the droplets dispersed in the cured polymeric binder.

17. A quantum dot film article comprising:
a first barrier layer;
a second barrier layer; and
a quantum dot layer between the first barrier layer and the second barrier layer, the quantum dot layer comprising the composite particles of claim 1, the composite particles dispersed in a carrier fluid, and dispersed in a polymeric binder.

18. The quantum dot film article of claim 17 wherein the quantum dot layer comprises dispersed droplets of composite particles in a carrier fluid.

19. A composition comprising the composite particle of claim 1 dispersed in a polymeric or non-polymeric carrier fluid.

\* \* \* \* \*

UNITED STATES PATENT AND TRADEMARK OFFICE
CERTIFICATE OF CORRECTION

PATENT NO. : 10,829,687 B2  
APPLICATION NO. : 15/745745  
DATED : November 10, 2020  
INVENTOR(S) : Palazzotto et al.

Page 1 of 1

It is certified that error appears in the above-identified patent and that said Letters Patent is hereby corrected as shown below:

In the Specification

Column 1,

Line 50-54 (approx.) (structure), delete " 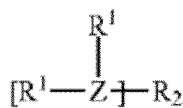 " and insert -- 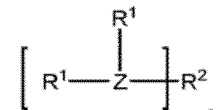 --, therefor.

Column 4,  
Line 62, delete "$Al_2CO_3$" and insert -- $Al_2CO$, --, therefor.

Column 8,

Line 58-64 (structure), delete " 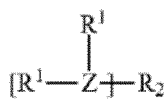 " and insert -- 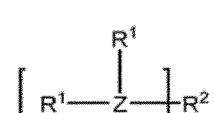 --, therefor.

Column 15,  
Line 16, delete "(Mn)" and insert -- ($M_n$) --, therefor.

Signed and Sealed this  
Twenty-second Day of June, 2021

Drew Hirshfeld  
*Performing the Functions and Duties of the*  
*Under Secretary of Commerce for Intellectual Property and*  
*Director of the United States Patent and Trademark Office*